(12) United States Patent
Lu

(10) Patent No.: US 12,197,262 B2
(45) Date of Patent: *Jan. 14, 2025

(54) ARRANGEMENT OF FIRST STAGE POWER FACTOR CORRECTION CIRCUIT AND SECOND STAGE DC/DC CONVERTER BETWEEN PACKAGE AND MOTHERBOARD OF IT EQUIPMENT

(71) Applicant: AA Power Inc., Boston, MA (US)

(72) Inventor: Qun Lu, Lexington, MA (US)

(73) Assignee: AA Power Inc., Boston, MA (US)

( * ) Notice: Subject to any disclaimer, the term of this patent is extended or adjusted under 35 U.S.C. 154(b) by 120 days.

This patent is subject to a terminal disclaimer.

(21) Appl. No.: 17/880,710

(22) Filed: Aug. 4, 2022

(65) Prior Publication Data
US 2023/0052000 A1 Feb. 16, 2023

Related U.S. Application Data

(60) Provisional application No. 63/298,385, filed on Jan. 11, 2022, provisional application No. 63/289,351, filed on Dec. 14, 2021, provisional application No. 63/233,492, filed on Aug. 16, 2021.

(51) Int. Cl.
*G06F 1/26* (2006.01)
*H02J 9/06* (2006.01)
*H02M 1/42* (2007.01)

(52) U.S. Cl.
CPC ............ *G06F 1/263* (2013.01); *H02J 9/061* (2013.01); *H02M 1/4208* (2013.01)

(58) Field of Classification Search
None
See application file for complete search history.

(56) References Cited

U.S. PATENT DOCUMENTS

| | | | | |
|---|---|---|---|---|
| 5,847,948 A * | 12/1998 | Gatto | ................. | G06F 1/26 363/65 |
| 8,867,250 B2 * | 10/2014 | Hua | ................. | H02M 3/33507 363/125 |
| 10,108,234 B1 * | 10/2018 | Hou | ................. | G06F 1/20 |
| 2009/0021078 A1 * | 1/2009 | Corhodzic | ............. | G06F 1/263 361/627 |
| 2009/0147175 A1 * | 6/2009 | Tsumura | ............... | G06F 1/1601 349/58 |
| 2009/0161395 A1 * | 6/2009 | Hua | ................. | H02M 3/33507 363/89 |
| 2009/0284077 A1 * | 11/2009 | Huang | ................. | H02J 3/007 307/80 |
| 2010/0164427 A1 * | 7/2010 | Dishman | ........... | H05K 7/20209 318/705 |

(Continued)

*Primary Examiner* — Danny Chan
(74) *Attorney, Agent, or Firm* — Occhiuti & Rohlicek LLP

(57) ABSTRACT

A dual-input power supply has two power paths that connect a server to electrical Each power path has a first stage that comprises a power-factor correction circuit. The power paths share a common second stage that comprises a dc/dc converter. The first stages of the power paths collectively defining a pair of first stages that is disposed either within a package that is off the motherboard or without a package and on the motherboard. Similarly, the second stage is disposed either within a package that is off the motherboard or without a package and on the motherboard.

23 Claims, 25 Drawing Sheets

(56) References Cited

U.S. PATENT DOCUMENTS

| | | | |
|---|---|---|---|
| 2011/0157934 A1* | 6/2011 | Clemo | H02J 1/102 |
| | | | 363/71 |
| 2015/0245531 A1* | 8/2015 | Meinecke | H05K 7/20736 |
| | | | 361/679.02 |
| 2016/0065077 A1* | 3/2016 | Yamada | H02M 1/42 |
| | | | 363/21.01 |
| 2017/0170733 A1* | 6/2017 | Ferencz | H02M 3/33571 |
| 2017/0201122 A1* | 7/2017 | Arduini | H02J 9/061 |
| 2019/0103761 A1* | 4/2019 | Wyma | H02J 9/061 |
| 2020/0366091 A1* | 11/2020 | Ye | G06F 1/263 |
| 2021/0081013 A1* | 3/2021 | Wang | G06F 1/20 |
| 2021/0208649 A1* | 7/2021 | Ji | G06F 1/263 |
| 2022/0263339 A1* | 8/2022 | Wang | H02J 4/00 |
| 2023/0008116 A1* | 1/2023 | Lou | H05K 9/0041 |
| 2023/0140489 A1* | 5/2023 | Han | H05K 7/209 |
| | | | 307/31 |

\* cited by examiner

ARRANGEMENT OF FIRST STAGE POWER FACTOR CORRECTION CIRCUIT AND SECOND STAGE DC/DC CONVERTER BETWEEN PACKAGE AND MOTHERBOARD OF IT EQUIPMENT

RELATED APPLICATIONS

This application claims the benefit of the priority dates of U.S. Provisional Application No. 63/298,385, filed on Jan. 11, 2022, U.S. Provisional Application No. 63/289,351, filed on Dec. 14, 2021, and U.S. Provisional Application No. 63/233,492, filed on Aug. 16, 2021.

BACKGROUND

Many commercial transactions rely on data stored on servers located at data centers. It is therefore important that these servers remain operational. Without continuous operation, commercial transactions would occasionally be disrupted.

Various electrical components at data centers require electricity to operate. These components include the servers themselves together with the routers and switches that connect them to the external world. These components, referred to herein as "power consumers," require a source of electricity. If that source of electricity were to become inoperative, so too would these components.

Available power as supplied from utilities take the form of an ac waveform. While ac power is useful for running motors, it is unsuitable for powering devices that rely on logic circuits. As a result, power supplies for such devices typically comprise an ac-dc power supply that receives ac power and converts it to dc for consumption.

The task carried out by the ac-dc power supply is a grueling one. As a result, various components of this power supply are likely to fail long before the power consumers that they feed. The most likely failure points are fans, relay switches, and electrolytic capacitors. Since the expected lifetime of a power supply is much less than that of whatever the power supply feeds, it is prudent to promote redundancy in power supplies and to provide some way to quickly replace a power supply should this be necessary.

As an example, many power consumers have two power supplies that work in tandem. Should one fail, the other can continue to operate, albeit for a limited period. When such failure occurs, an alert is sent to a human operator, who quickly replaces the failed power supply with a new power supply so as to restore tandem operation. This procedure avoids interruptions that would otherwise arise from failure of a power supply.

This procedure results in extra costs, since two power supplies are required. It also requires extra space to accommodate the redundant power supplies. In addition, the procedure requires that a human operator be on hand to carry out power-supply replacement and to do so within a limited period.

SUMMARY

The invention provides a dual-input power supply that is made to be more compact by sharing certain components. For example, in some embodiments, there are two power-factor conversion circuits, one for each input. However, these power-factor conversion circuits share a single dc/dc converter. This dc/dc converter circuit inherently has a longer lifetime.

The shared dc/dc converter is implemented as a separate module, or package, that is separate from the power-factor correction circuits. In other embodiments, the shared dc/dc converter is implemented directly on a motherboard of the power consumer, such as the motherboard of a server or stand-alone server.

In one aspect, the invention features an apparatus that includes a power supply for providing power to a load. Among these are embodiments in which the load is a stand-alone server. The server has a motherboard that has load circuitry thereon. The power supply is a dual-input power supply in which first and second paths connect to electrical power, which is typically but not necessarily ac power. Each of the first and second power paths connects to the load. Each power path includes a first stage, which has a power-factor correction circuit. The power paths share a common second stage, which has a dc/dc converter. The first stages of the power paths collectively define a pair of first stages that is disposed either within a package that is off the motherboard or without a package and on the motherboard. Similarly, the second stage is disposed either within a package that off the motherboard or without a package and on the motherboard.

Embodiments include those in which the electrical power comprises an ac power source to which both first and second power paths connect, and those in which the electrical power comprises first and second ac power sources and the first and second power paths connect to the corresponding first and second ac power sources, and those in which the electrical power source comprises a dc power source.

In some embodiments, the power supply includes a first package that includes the pair of first stages and a second package that includes the second stage. The first package is insertable between the electrical power and the second package. The second package is insertable between the load and the first package. As a result, the pair of first stages is removable from the power supply without removing the second stage and the second stage is removable from the power supply without removing the pair of first stages.

Embodiments also include those the power supply includes a package that is insertable between the electrical power and the motherboard and the second stage is disposed on the motherboard along with the load circuitry. In this embodiment, the pair of first stages is disposed within the package. The second stage is not enclosed in a package.

In another embodiment, the first stage and the second stage are both disposed on the motherboard along with the load circuitry.

As used herein, a "module" or "package" is a first set of electrical components that interact with a second set of electrical components, wherein the electrical components of the first set interact with each other, are encased in a housing that provides one or more terminals, receive and transmit electrical energy to electrical components in the second set only through those terminals, and that can only be removed from only be separated from the second set as a unit, such that if a first element and a second element are in the first set, it is not possible to remove the first element from the union of the first and second sets without also removing the second element.

In some embodiments, the power supply comprises zero fans. In other embodiments, the power supply comprises a fan. Among these are embodiments having a heat sensor and a controller that turns on the fan when temperature exceeds a threshold.

Among the embodiments are those that include first and second heat sinks on the motherboard. The first heat sink is in communication with the pair of first stages. The second heat sink is in thermal communication with the second stage.

Other embodiments include first and second heat shields disposed on the motherboard to prevent a user from inadvertently coming into contact with the pair of first stages and the second stage, respectively. The first heat shield is disposed to cover the pair of first stages and the second heat shield is disposed to cover the second stage.

Other embodiments include electromagnetic-interference shields disposed on the motherboard disposed to prevent electromagnetic interference from the pair of first stages and from said second stage from interfering with circuitry on the motherboard that is used for computational tasks. In such embodiments, the first electromagnetic-interference shield is disposed to electromagnetically isolate the pair of first stages and the second electromagnetic-interference shield is disposed to electromagnetically isolate the second stage.

Suitable shields in either case include housings with multiple apertures to promote air circulation. In such cases, the apertures for the electromagnetic-interference shields are smaller than those in the heat shields.

Among the various embodiments are those in which the electrical power to which the two paths connect includes a common ac power source that connects to both the first and second power paths and those in which the electrical power to which the two paths connect includes first and second ac power sources, wherein the first power path connects to the first ac power source, and wherein the second power path connects to the second ac power source.

In still other embodiments, the electrical power to which the first and second paths connect includes dc power to which the first and second paths connect such that when the power supply is connected to the dc power, the first stage is bypassed.

In some embodiments, each first stage includes capacitors and transformers in which the capacitors and transformers collectively sustain a voltage equal to that provided by a source of the electrical power. In such embodiments, each of the input capacitors sustains a fraction of the voltage and each of the capacitors is connected across a primary winding of a corresponding one of the transformers, which are themselves cascaded. The secondary windings of the transformers are tied together such that the second stage receives a voltage that is the sum of that across each of the capacitors.

In still other embodiments, the load comprises IT equipment located at a data center, such as a server, router, or switch.

Also among the embodiments are those in which the first and second power paths share one or more of a common transformer, a common inductor, and a common hold-up capacitor.

In some embodiments, the apparatus is configured for providing continuity of power to the server. In such embodiments, the electrical power includes first and second power sources that operate independently of each other. The second power path maintains a connection between the second power source and the server while the second power source has sustained a fault that prevents the second power source from providing power. The first power path maintains a connection between the first power source and the server while the first power source has sustained a fault that prevents the first power source from providing power. The power supply retains the same configuration regardless of how many of the power sources are operational. In these embodiments, the first stages of the first and second power paths are non-isolated from each other.

Other embodiments include a first shield that surrounds the pair of first stages and a second shield that surrounds the second stage. In such embodiments, the first and second shields have multiple apertures to promote air circulation. This helps cool the power supply. Among these are embodiments that also include first and second grounded electromagnetic interference shields disposed to suppress electromagnetic interference resulting from operation of the pair of first stages and the second stage. Such electromagnetic interferences arises, for example, from rapid switching events. In such embodiments, apertures on the electromagnetic interference shields are smaller than the apertures on the heat shields.

Also among the embodiments are those in which the pair of first stages is hot-swappable and the second stage is non-hot-swappable, those in which the pair of first stages and the second stage are hot-swappable independently of each other, and those in which neither the pair of first stages not the second stage are hot-swappable.

As used herein, "hot-swappable" circuitry is circuitry that can be removed upon failure thereof and replaced with similar but functioning circuitry without having to power down the device from which that circuitry is being removed.

In some embodiments, the power supply is a passively-cooled dual-input power supply.

Also among the embodiments are those in which circuitry on the motherboard has an average operating temperature that is higher than that of the load circuitry and those in which the motherboard has an average operating temperature that is equal to the operating temperature of the load circuitry. In the latter case, the pair of first stages and the second stage are separately packaged.

Embodiments include those in which the electrical power comprises first and second power sources and the power supply is configured to switch between the first and second power sources without the use of a mechanical transfer switch.

Still other embodiments include those in which the motherboard comprises, in addition to the load circuitry, at least some circuitry from the power supply.

In another aspect, the invention features a method that includes providing continuous dc power to a server at a data center. In such a method, providing said continuous dc power comprises, using a first power path, maintaining a connection between the server and a first power source, using a second power path, maintaining a connection between the server and a second power source. The first and second power sources operate independently of each other. The act of providing the continuous dc power further includes, upon occurrence of an inability of the first power source to provide power, maintaining the connection to the first power source. Each of the power paths includes a first stage that includes a power-factor correction circuit. The two power paths share a common second stage that includes a dc/dc converter. The first stages of the power paths collectively define a pair of first stages that is disposed either within a package that is off the server's motherboard or without a package and on the motherboard. Similarly, the second stage is disposed either within a package that off the motherboard or without a package and on the motherboard.

In another aspect, the invention features a dual-input power supply. As used herein, a "dual-input power supply" is a power supply that is configured to receive input ac power from two different ac power sources over separate first and second inputs and to convert that ac power into dc power for use by information technology equipment that is operating in a data center, and in particular, to receive ac power from two different ac power sources and to provide dc power to one or more loads that are operating in a data center. The dual-input power supply includes first and second power paths that maintain a connection between the load at the data center and both ac power sources even while one of the ac power sources fails. As a result, no automatic transfer switch is required to provide continuity of power.

In some embodiments, the first stages each comprise a primary winding. These primary windings are magnetically coupled to a secondary winding via a transformer.

In other embodiments, the electrical power includes power sources that work independently of each other. In such embodiments, each of the first stages of the first and second power paths includes a transistor and a primary winding. The transistor connects a corresponding one of the power sources to the primary winding. A controller then controls both of the transistors.

In yet other embodiments, each of the first stages includes a winding and a capacitor that is parallel to the winding. The first stages are configured to cause the capacitors to cooperate to form a single hold-up capacitor that is shared by both the first and second power paths.

In still other embodiments, the electrical power includes power sources that work independently of each other. In such embodiments, the power supply is configured to draw power only from whichever one of the first and second power sources offers a higher voltage.

In another aspect, the invention features a dual-input ac/dc power supply having dual inputs for connecting to two different ac power sources. The dual-input ac/dc power supply connects to a server at a data center and provides that load, as well as possibly other loads in the data center, with dual connections, one for each of a first and second ac power source that operate independently of each other. The dual-input power supply includes a first power path that connects the first power source to the load at the data center and a second power path that connects the second power source to that same load at the same data center. The second power path maintains a connection between the second ac power source and the load at the data center while the second power source has sustained a fault that prevents the second power source from providing power. Similarly, the first power path maintains a connection between the first power source and the load at the data center while the first power source has sustained a fault that prevents the first power source from providing power. The power supply retains the same configuration regardless of how many of the power sources are operational. In particular, there is no switch that must be reconfigured to accommodate the loss of one power source.

Among the embodiments are those that include a package. In such embodiments, the power paths are in the package.

Also, among the embodiments are those in which the first and second power paths share one or more common components. Among these are embodiments in which the common component has been selected to avoid changing path-failure probabilities of each of the first and second paths as well as those in which the common component has been selected to reduce total area occupied by the first and second power paths.

A test to determine whether the path-failure probabilities have changed begins by constructing two power paths with no common components. Then, one measures the path-failure probabilities. Next, one constructs third and fourth power paths that are identical to the first and second with the exception that a shared component exists. One then measures the path-failure probabilities. One can then compare the path-failure probabilities to determine whether they have changed.

Embodiments include those in which the common component comprises a dc/dc converter, those in which the common component comprises a transformer, those in which the common component comprises an inductor, those in which the common component comprises a hold-up capacitor, and those in which the common component comprises energy-storage component.

As used herein, the term "common" is not intended to mean "not unusual." A component is said to be "common" to two circuits if both circuits use that component during operation thereof.

In another aspect, the invention features a method of providing continuous dc power to a load at the data center. Such a method includes using a first power path to maintain a connection between the load at the data center and a first ac power source, using a second power path to maintain a connection between the load and a second ac power source, wherein the second ac power source operates independently of the first power source, and upon occurrence of an inability of the first ac power source to provide power, maintaining the connection to the first ac power source.

A multi-path power supply as described and claimed herein overcomes the disadvantages of an automatic-transfer switch by eliminating the switch altogether. This, in turn, avoids the complexity of having to measure and control mechanical switches quickly enough to prevent disruption of power flow Eliminating the automatic-transfer switch also avoids the delay that arises from the time required to determine that a first power supply has stopped working, the time required for a transfer switch to disconnect the first power supply, the time required for the transfer switch to connect a second power supply, and the time required to transition the second power supply from a condition in which it supplies no power into a condition in which it supplies the power necessary to replace the first power supply.

In a first embodiment, the invention features a redundant power supply for receiving input ac power and providing dc power to operate information technology devices operating at a data center. Within the redundant power supply, two input ac sources are connected to corresponding first and second inputs that lead to corresponding independent ac/dc converters in a single enclosure with common components on the dc side of the ac/dc converters. Such an embodiment avoids the need for a transfer switch and thus avoids the timing issues that arise with the use of a transfer switch. Instead, such an embodiments functions as if it were a single power supply even though it is, in reality, a pair of power supplies. As a result, the redundant power supply needs only one cooling system. Additionally, by having common dc-side components, it is possible to use fewer parts than would have been necessary when two complete power supplies are used.

There exist a variety of components that lend themselves to being shared among two power paths of a redundant power supply. Among these are those components associated with such functions as providing a housekeeping power supply, monitoring the output power and protecting it from fluctuations, such as a controller, and a bias-power supply.

In a second embodiment, the invention features a power converter having two isolated power-factor correction stages and a pair of switches controlled by a common controller, with one of the switches being disabled when both ac sources are available at the dual inputs. Among these are embodiments in which the isolated power-factor correction stages connect to a single dc/dc stage, that is then shared between two power paths. In such embodiments, the power-factor correction circuit relies on the source having the higher voltage. A controller controls a pair of switches that provide a connection to the corresponding ac sources. In operation, the controller disables one of these switches when both ac sources are available.

In such a power supply, the two ac power sources are isolated by a transformer rather than through the use of a switch. This promotes operator safety during both installation and operation of the ac/dc power supply at the data center.

An additional advantage arises because the bulk capacitor reduces the capacitance required to provide stored energy to a load at a data center. Such stored energy is needed to make up for short losses of power during transitions between ac power sources as well as disturbances that arise during normal operation. A bulk capacitor is a large and expensive component. Thus, by avoiding the need to provide a separate bulk capacitor for each power path, it is possible to reduce costs.

In a third embodiment, a redundant power supply features two isolated power-factor correction stages. These power-factor correction stages share a common controller and also share a magnetic core of an isolation transformer. The two power-factor correction stages ultimately connect to a common dc/dc stage. This third embodiment also includes a pair of switches, one for each of the two power-factor correction stages. The controller causes one of the switches to be "off" when both ac sources are operational. Each of the isolated power-factor correction stages provide power-factor correction and an input dc voltage to a dc/dc converter. The dc/dc converter transforms the input into a voltage that is suitable for use by a load at a data center. This embodiment likewise promotes safety during installation and operation as a result of avoiding isolation through switches.

In a fourth embodiment, an input redundant power supply includes two non-isolated first stages, each of which is includes a power-factor correction circuit. The outputs of both of the non-isolated power-factor correction stages connect to corresponding windings around a core of a transformer of a dc/dc converter. Each of the non-isolated power-factor correction stages includes a switch that controls current provided to a corresponding one of the windings. A controller controls both of these switches in such a way as to cause them to concurrently transition between states. Two ac/dc power strands share the same control circuitry. In this embodiment, each power-factor correction circuit includes a hold-up capacitor. However, as a result of the topology, the two hold-up capacitors cooperate to form what is effectively a single capacitor having twice the capacitance.

The power-factor correction stages referred to above, whether isolated or non-isolated, include those that are implemented using forward topology, flyback topology, and fly-forward topology. In all these cases, there exists a transistor that controls current flow to an isolation transformer's primary winding is used to deliver power from its primary side to its secondary side. In the forward topology, power transfer occurs when the transistor is conducting. In flyback topology, power transfer occurs when this transistor switch is non-conducting state. In fly-forward topology, power transfer occurs when the transistor transitions between states.

In a fifth embodiment, an input redundant power supply includes two non-isolated first stages, each of which is implemented as a power-factor correction circuit. Each power-factor correction circuit has, its output, a winding. The resulting two windings wind around the core of a common transformer of a dc/dc converter. As a result, the two first stages share a common magnetic core.

Additionally, each power-factor correction circuit has a switch that controls current to its corresponding winding. A single controller controls both of these switches. As a result, the same control signal will be available to both switches. This permits the switches to transition between states concurrently. As a result, the two first stages also share a common controller. In such an embodiment, only one of the two switches will be in a conducting state when both ac sources are operational. The other switch will be in a non-conducting state.

In addition, each power-factor correction circuit features a hold-up capacitor. As a result of the illustrated topology, the hold-up capacitors cooperate to form a larger capacitor that is shared by both power-factor correction circuits during all phases of operation.

As was the case for the preceding embodiments, the second stage is implemented as a dc/dc converter configured with one of a forward topology, a flyback topology, and a fly-forward topology.

Elimination of the transfer switch offers several advantages.

First, the transfer switch itself is a mechanical switch that is large and expensive. This adds to the cost of the power supply and to the area that it consumes.

Moreover, because it is a mechanical switch, the transfer switch requires significant time to actually switch. The load, however, cannot tolerate a discontinuity in power. Thus, a large supply of charge must be made available to provide power for the load during the lengthy interval during which the transfer switch is carrying out the act of switching. This large supply of charge is typically stored in a capacitor, which will be referred to herein as the "hold-up capacitor." The capacitor is typically an electrolytic capacitor that consumes a considerable amount of space. This reduces the power density, i.e., ratio between the power handled by the power supply and the space that the power supply occupies.

To make matters worse, since the transfer switch is a mechanical switch, it has a limited number of cycles before its own failure probability rises to an unacceptable value. For a typical switch, it is usual to replace the switch after about a thousand switching events.

Secondly, the switch is itself prone to failure. As a result, with the switch present, the first and second power paths would not truly be independent. They would both rely on the switch. This tends to increase the probability that the load will lose power upon failure of one ac power source.

The illustrated power supply features first and second ac/dc converters in a single package that work together to supply dc power to one or more loads at a data center. If only one of the two ac power sources is available, the power supply will operate using power from that ac power source without the need to switch to it. If both ac power supplies are available, the power supply will work with both ac power sources or either one of the ac power sources to provide dc power to the one or more loads at the data center.

As a result of being in the same package, it becomes possible for the first and second ac/dc converters to share one or more components. Examples of components that are shareable include a case, a heatsink, a cooling fan, and a printed-circuit board. It is also possible to share communication circuitry, a cooling device, monitoring circuitry, and control circuitry.

In many embodiments, each converter comprises a power-factor correction stage that couples to a dc/dc stage. In such embodiments, it is possible to isolate the power-factor correction stage and to thus share the dc/dc stage. It is also possible for the first and second converters to share a common hold-up capacitor, thus considerably reducing the area consumed by the power supply and greatly increasing its power density.

In many embodiments, the power-factor correction stage relies on an inductor. As a result of being in the same package, it becomes possible for power-factor correction stages of the first and second converters to share a common inductor's magnetic core using separate windings.

In still other embodiments, the dc/dc stage includes a dc transformer. As a result of being in the same package, it becomes possible for the dc/dc stages in the first and second converters to share a common dc transformer.

In yet other embodiments, a dc transformer is added to the power-factor correction stage. As a result of being in the same package, it becomes possible for the power-factor-correction stages in the first and second converters to share a common dc transformer.

These and other features of the invention will be apparent from the following detailed description and the accompanying remarks, in which:

DETAILED DESCRIPTION

Figure 1:
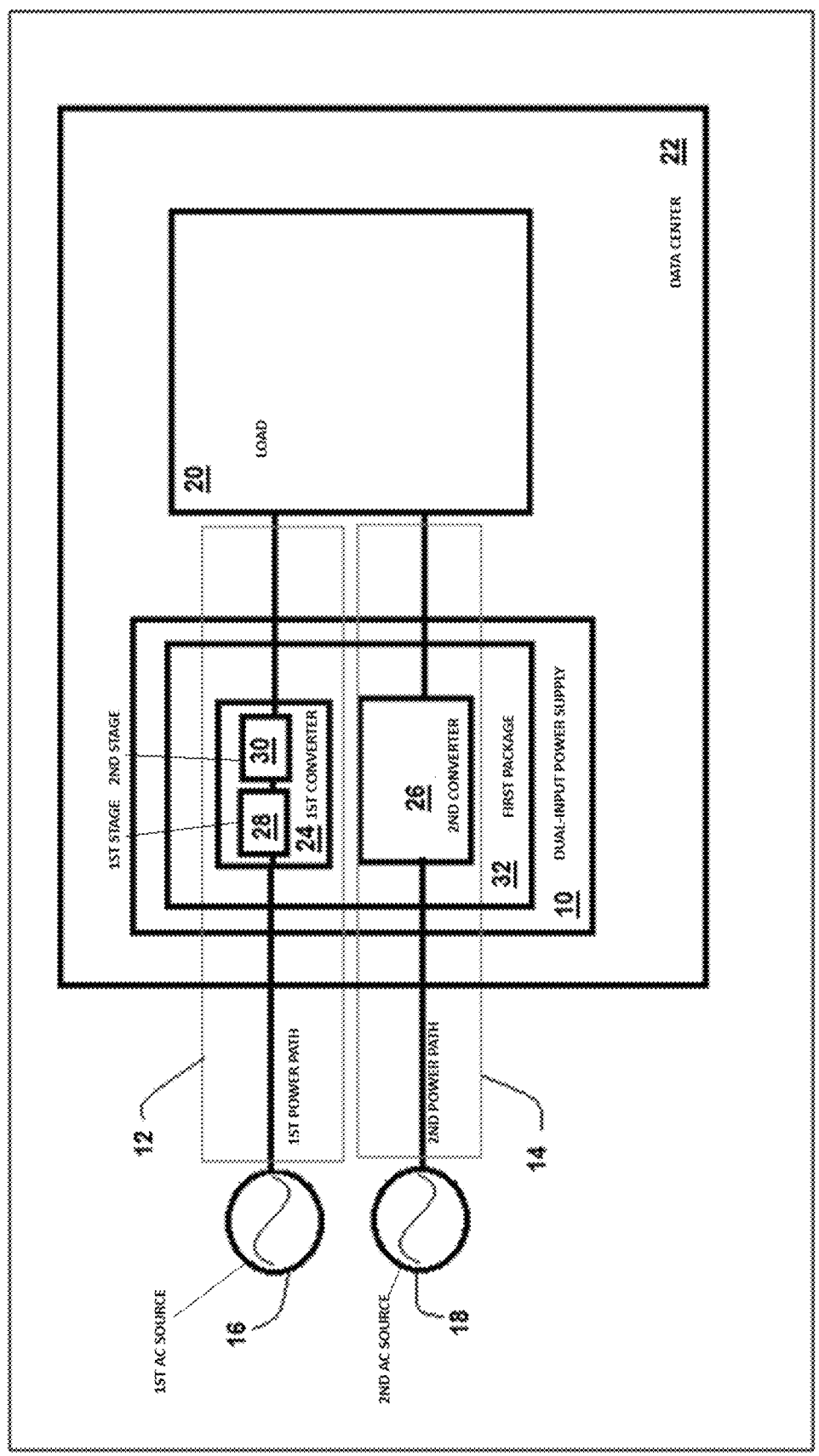
FIG. 1 shows the architecture of a power supply with power paths connected to independent ac sources for providing power to one or more loads at a data center.

FIG. 1 shows a dual-input power supply 10 that provides a first power path 12 and a second power path 14. The first power path 12 receives ac power from a first ac source 16. The second power path 14 receives ac power from a second ac source 18. Both the first power path 12 and the second power path 14 ultimately deliver power to a load 20 in a data center 22. Examples of a load 20 include a server, including a stand-alone server, a router, a switcher, and combinations thereof.

The power supply 10 includes a first converter 24 along the first power path 12 and a second converter 26 along the second power path 14. Each of the first and second converters 24, 26 is an ac/dc power converter.

The first converter 24 includes a first stage 28 and a second stage 30.

The first stage 28, which is often referred to as a "power-factor correction stage, converts ac received from the first ac source 16 into dc, which it then provides to the second stage 30. The second stage 30 transforms the dc that it receives from the first stage 28 into a dc voltage having the value required by the load 20. In the embodiments described herein, the second stage 30 comprises a dc/dc converter.

The second converter 26 includes first and second stages like the first converter 24. Accordingly, only the first and second stages 28, 30 of the first converter 24 are illustrated in FIG. 1. The first and second power paths 12, 14 share at least the same second stage 30.

In the embodiment shown in FIG. 1, the first and second stages 28, 30 are inside a first package 32.

Figure 2:
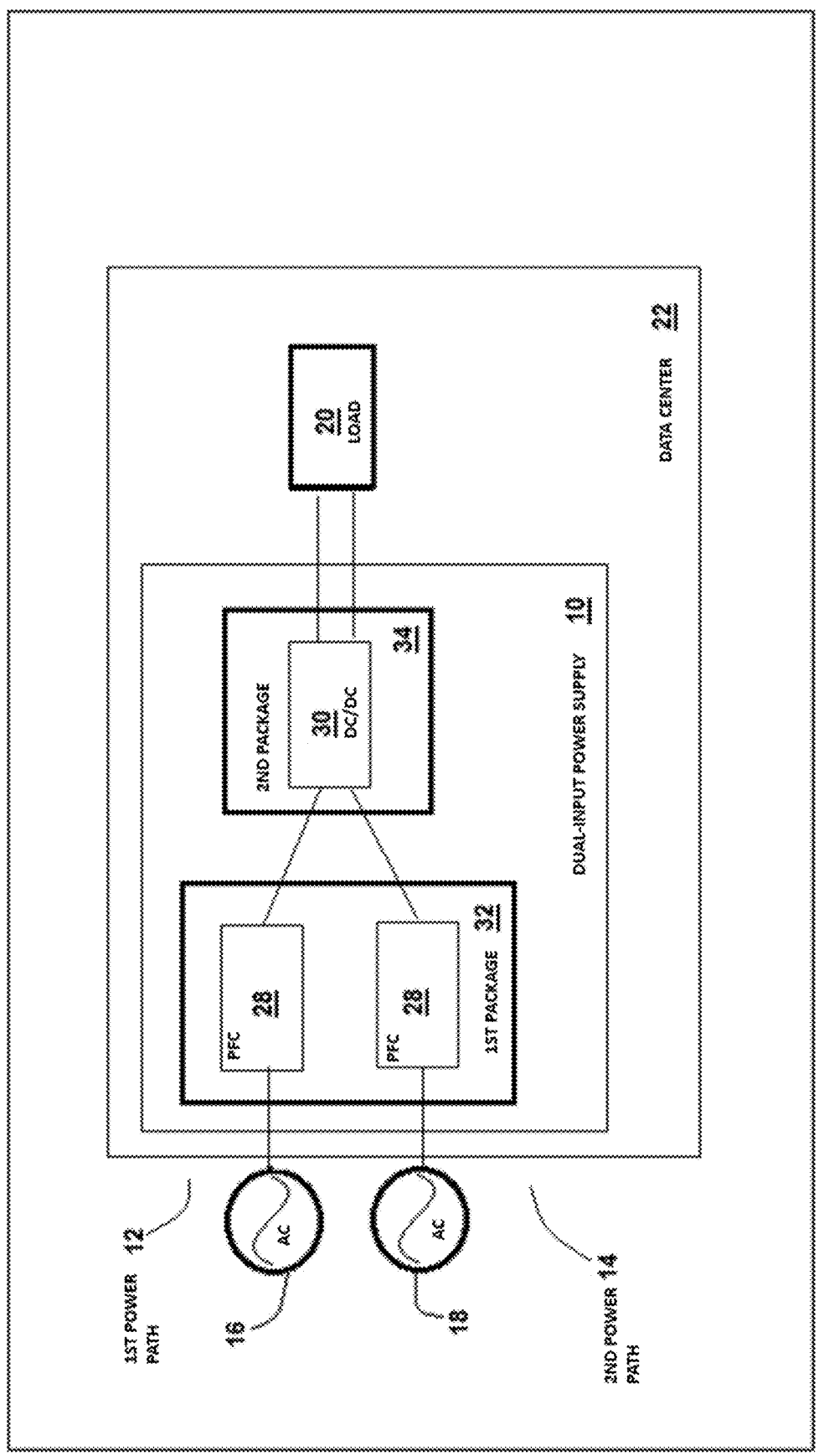
FIG. 2 shows the architecture of a power supply similar to that shown in FIG. 1 but with the first stages of the two power paths in a first package and the shared second stage of the power paths on a second package.

In an alternative embodiment, shown in FIG. 2, the first stage 28 of the first power path 12 is within the first package 32 and the first stage of the second power path 14 is also within the first package 32. The shared second stage 30 of the first and second power paths 12, 14 is within a second package 34. This configuration is advantageous because the expected lifetime of the second stage 30 is much greater than that of the first stage 28.

Figure 3:
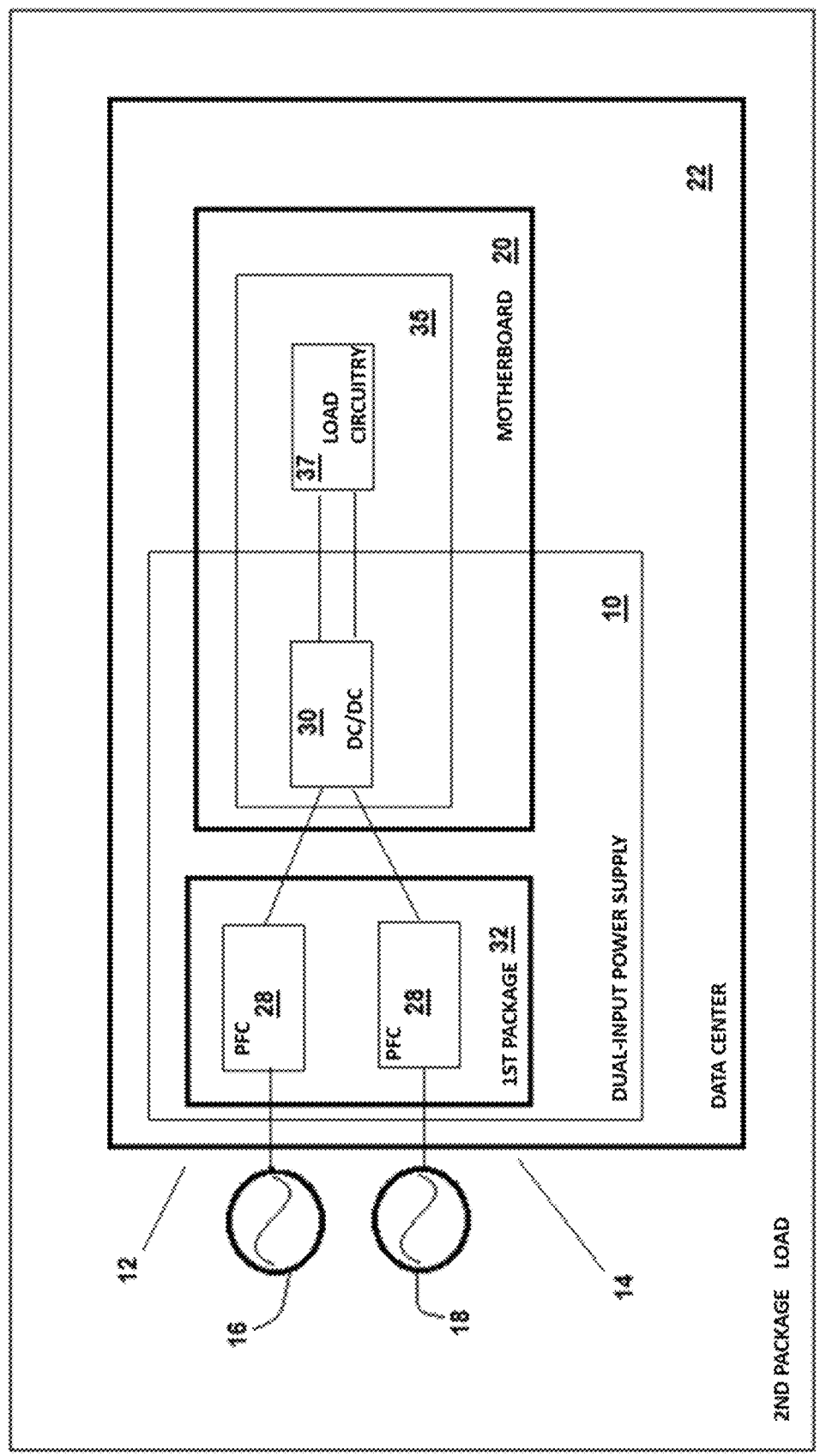
FIG. 3 shows the architecture of a power supply similar to that shown in FIG. 1 but with the first stages of the two power paths being within the same package and the shared second stage of the power paths being on a motherboard at the load.

In another embodiment, shown in FIG. 3, the first stage 28 of the first power path 12 is within the first package 32 and the first stage 28 of the second power path 14 is also within the first package 32. The shared second stage 30 of the first and second power paths 12, 14 is on a motherboard 35 that also holds circuitry 37 of the load 20. This offers the advantages of the architecture shown in FIG. 2 but with the additional advantage of avoiding loss due to connectors between the second package 34 and the load 20.

Figure 4:
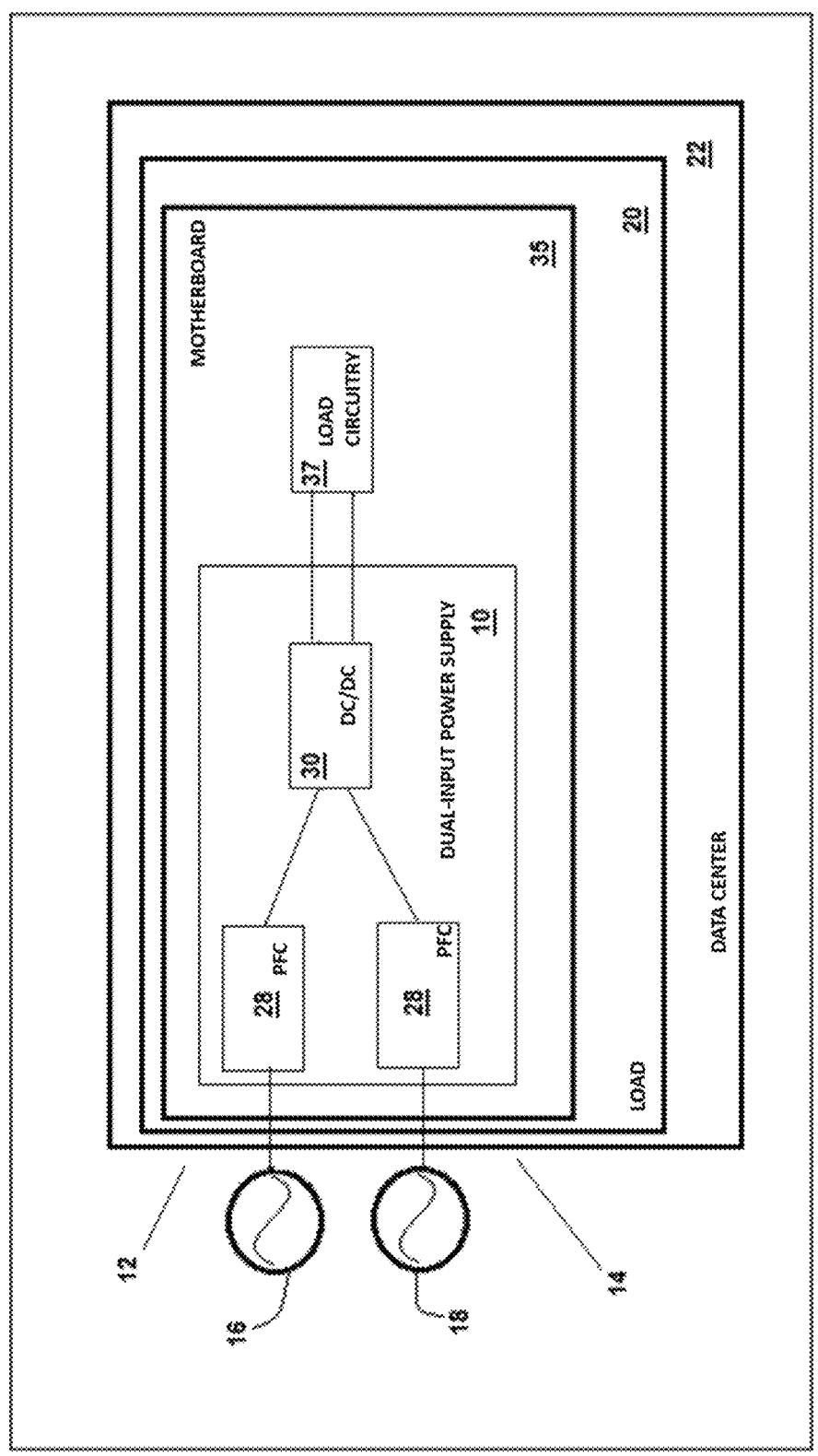
FIG. 4 shows the architecture of a power supply similar to that shown in FIG. 1 but with both power paths being on a motherboard at the load.

In another embodiment, shown in FIG. 4, the first stage 28 of the first power path 12, and the shared second stage 30 of the first and second power paths 12, 14 are all on a motherboard 35 that also holds circuitry 37 of the load 20. This offers the advantages of the architecture shown in FIG. 3 with the additional advantage of avoiding loss due to connectors between the first package 32 and the second package 34.

Figure 5:
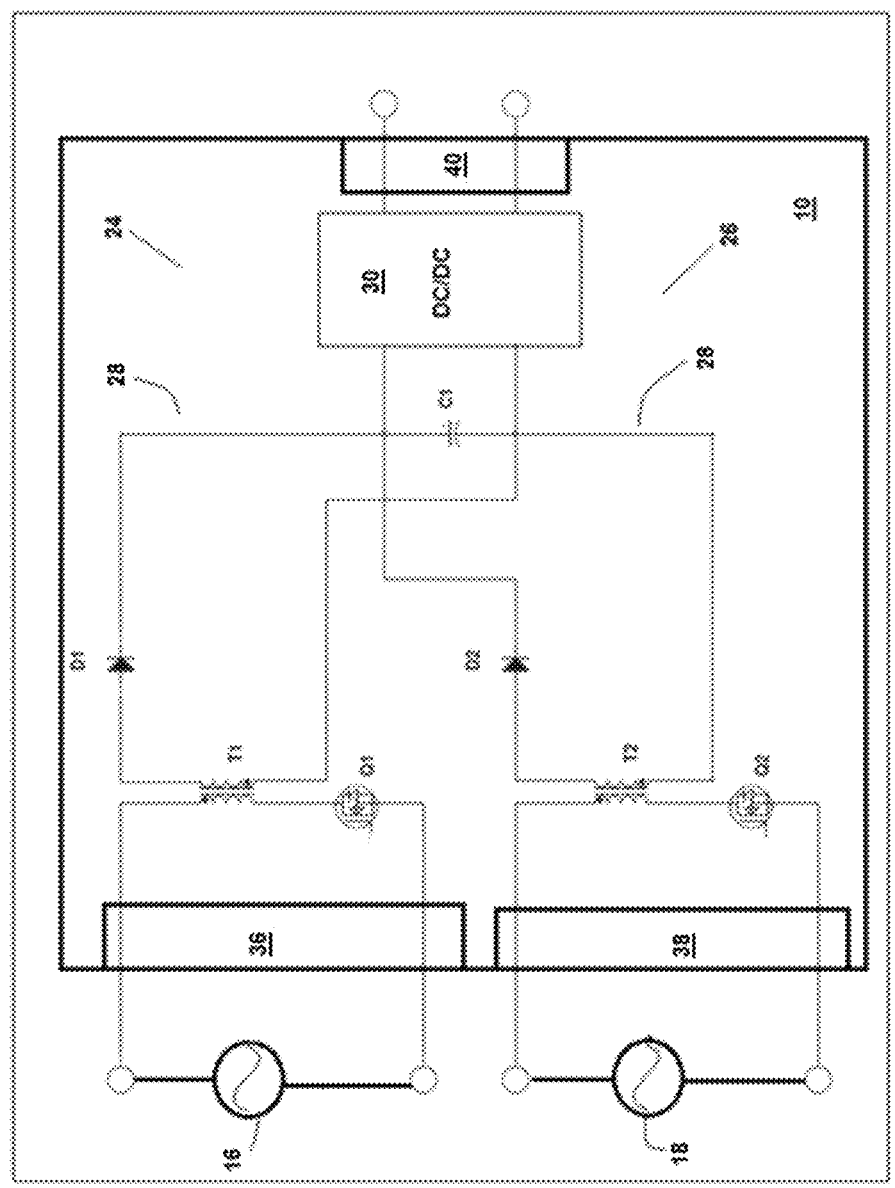
FIGS. 5-7 show power supplies in which the two isolated power paths, each of which comprises an isolated power-factor correction circuit, share a common dc/dc converter, a hold-up capacitor, and switches that are controlled by either a single controller or by two separate controllers.

FIG. 5 shows a power supply 10 having first and second inputs 36, 38 for connection to the first and second ac sources 16, 18, respectively. The power supply 10 further includes an output 40 for connection to the load 20 (not shown). The first and second converters 24, 26 each have a first stage 28. The two first stages 28 are isolated from each other. As a result, it is not possible for a short circuit to develop between the first and second ac sources 16, 18.

The first and second converters 24, 26 share a second stage 30 and a hold-up capacitor C1. In some embodiments, a single controller connects to the gate terminals through an isolated driver of first and second transistors Q1, Q2. In other embodiments, each of the first and second transistors Q1, Q2 has its own gate controller. In either case, current flow through corresponding first and second transformers T1, T2 is controlled.

In the illustrated embodiment, and in all other embodiments described herein, the hold-up capacitor is an electrolytic capacitor.

Throughout this specification, reference will be made to operation of the circuitry in response to failure of one of the first and second ac sources 16, 18. In each case, because of the symmetry of the circuits, operation will proceed in an analogous manner upon failure of the other of the first and second ac sources 16, 18.

Figure 6:
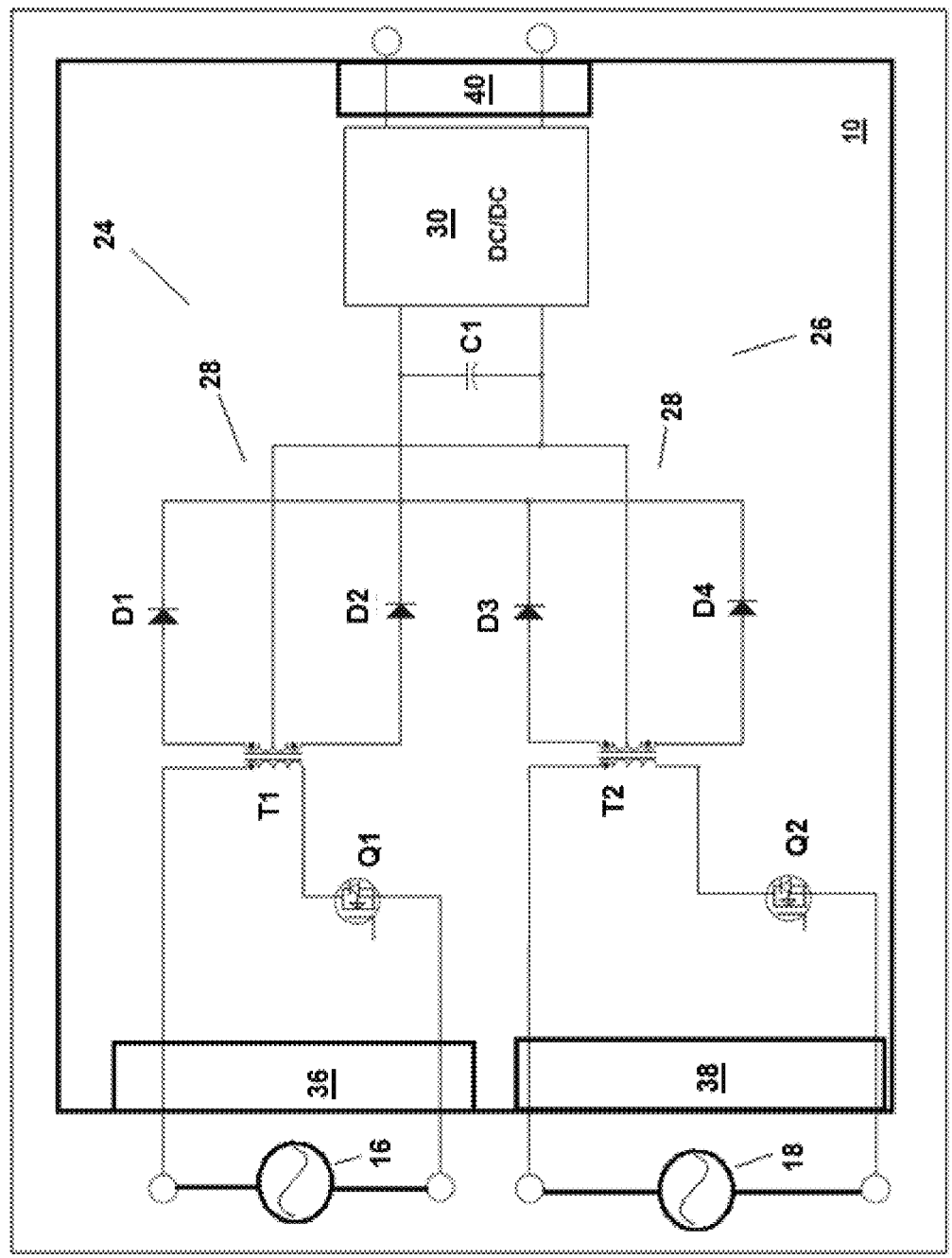
Figure 7:
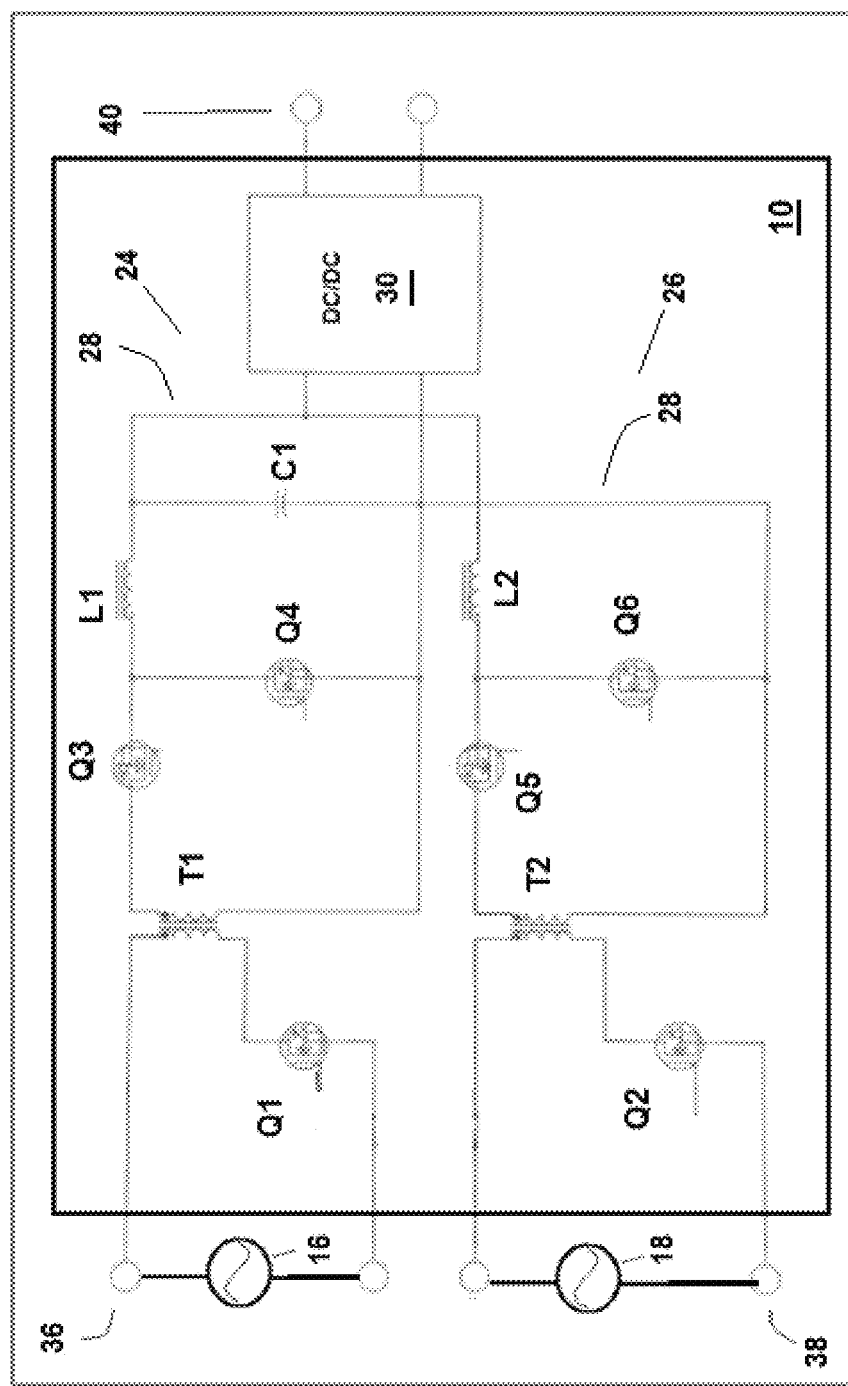

In FIG. 5, the first stage 28 comprises a power-factor correction circuit having a flyback topology. However, alternative topologies are possible. For example, FIG. 6 shows a power supply 10 similar to that shown in FIG. 5 but with the first stage 28 having a fly-forward topology instead of a flyback topology. FIG. 7 shows a power supply 10 similar to that shown in FIG. 5 but with its first stage 28 having a forward topology instead of a flyback topology.

When both the first and second ac sources 16, 18 are operational, the power supply 10 sees both voltages. In effect, each ac source 16, 18 offers the power supply 10 some power. The power supply 10 cannot, however, accept both offers. To do so would result in too much power at the load 20. Thus, the power supply 10 must have a way to accept one offer and reject the other. For ease of discussion, it is assumed that power is being drawn from the first ac source 16.

If the second ac source 18 were to fail, the power supply 10 would simply continue to draw from the first ac source 16 just as it has all along.

If, on the other hand, the first ac source 16 were to fail, then the first ac source 16 would no longer offer the higher of the two voltages. Thus, the power supply 10 would begin drawing current from the second power supply 22. This happens automatically, simply as a result of the circuit's topology. Accordingly, in principle it would not be necessary to have transistors Q1, Q2.

The first and second converters 24, 26 shown in FIGS. 5-7 share only a second stage 30 and a hold-up capacitor C1. They continue to have separate first and second transformers T1, T2. These transformers T1, T2 are physically large and consume significant area in the actual circuit.

Figure 8:
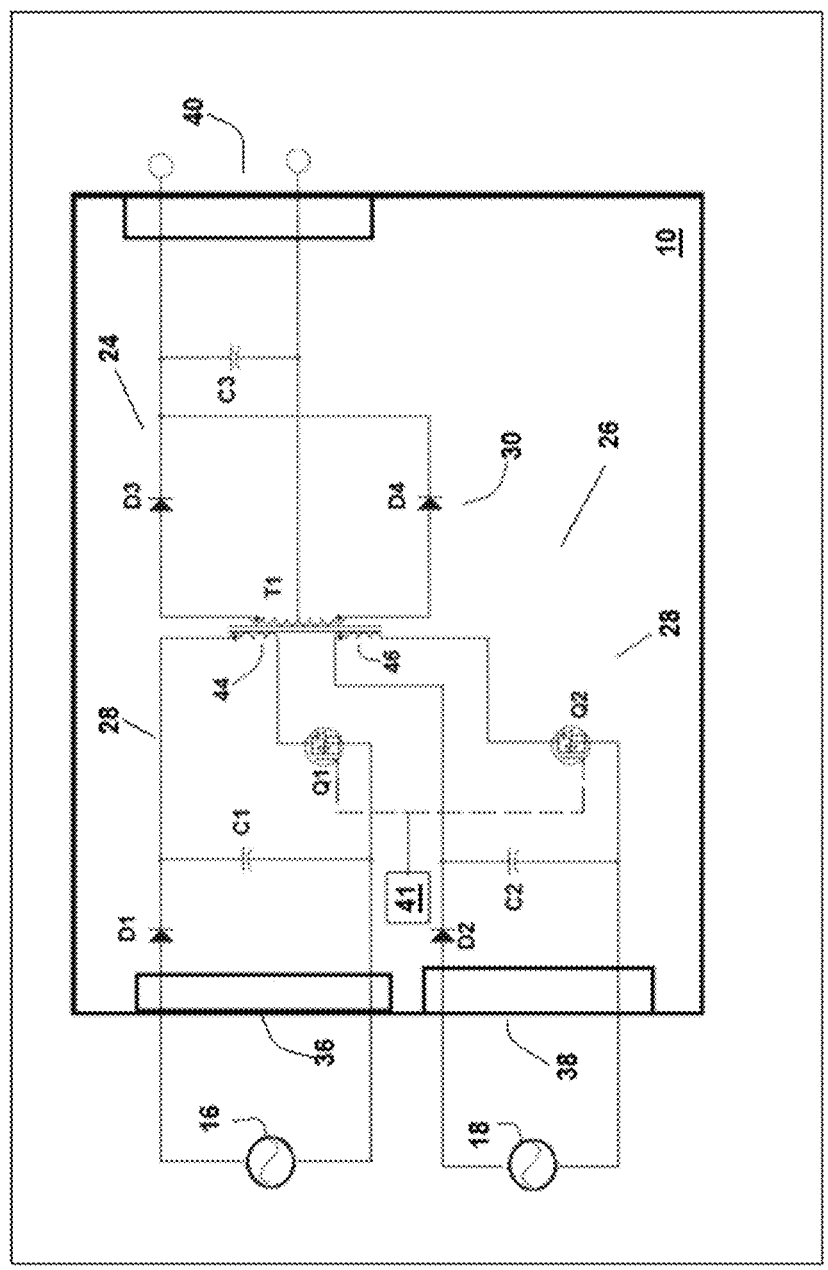
FIG. 8 shows two non-isolated power paths, each of which comprises a power-factor correction circuit, that share a dc/dc transformer's magnetic core, the remainder of the dc/dc converter, and a hold-up capacitor.
Figure 9:
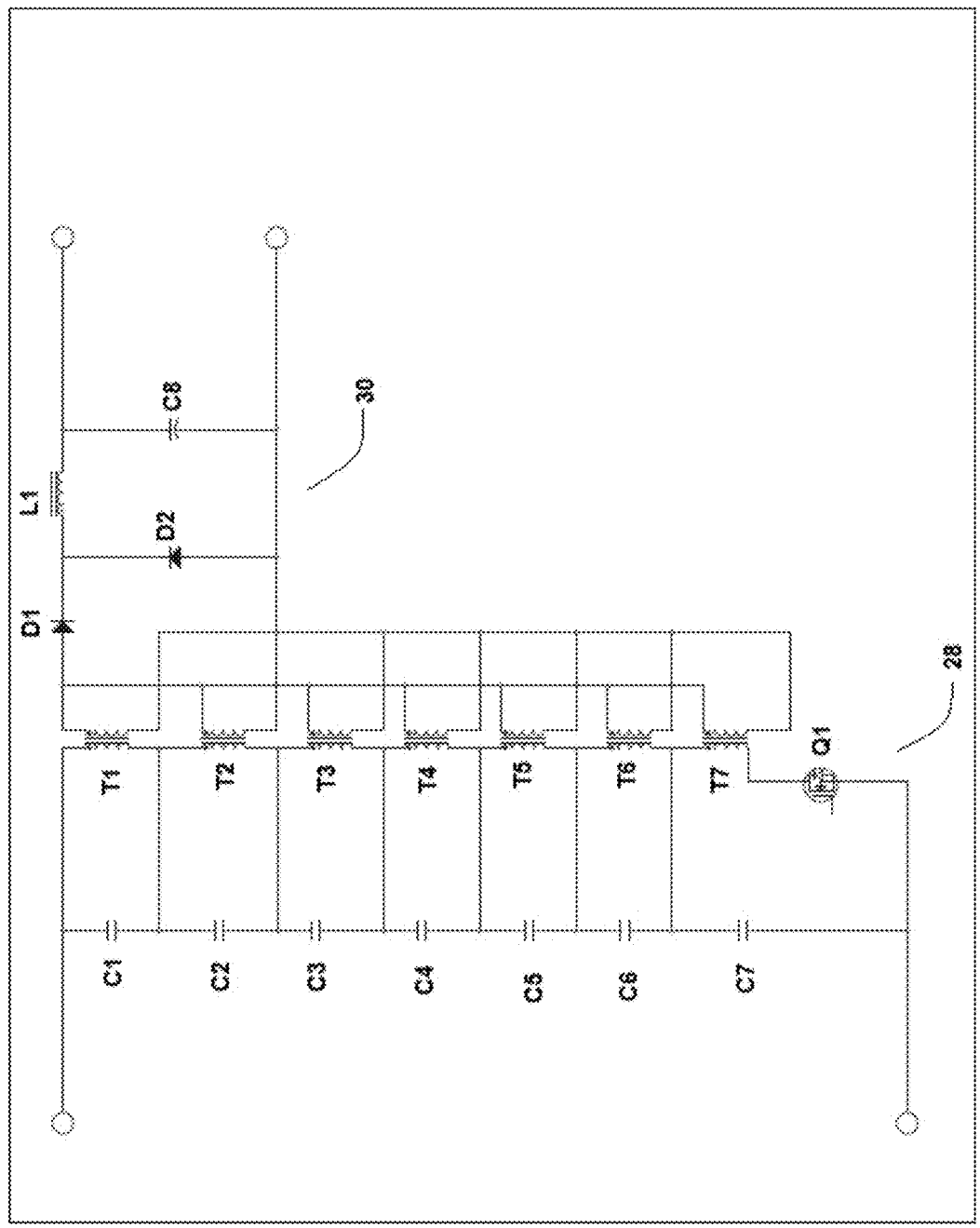
FIG. 9 shows details of a configuration of capacitors for a power-factor correction circuit.
Figure 10:
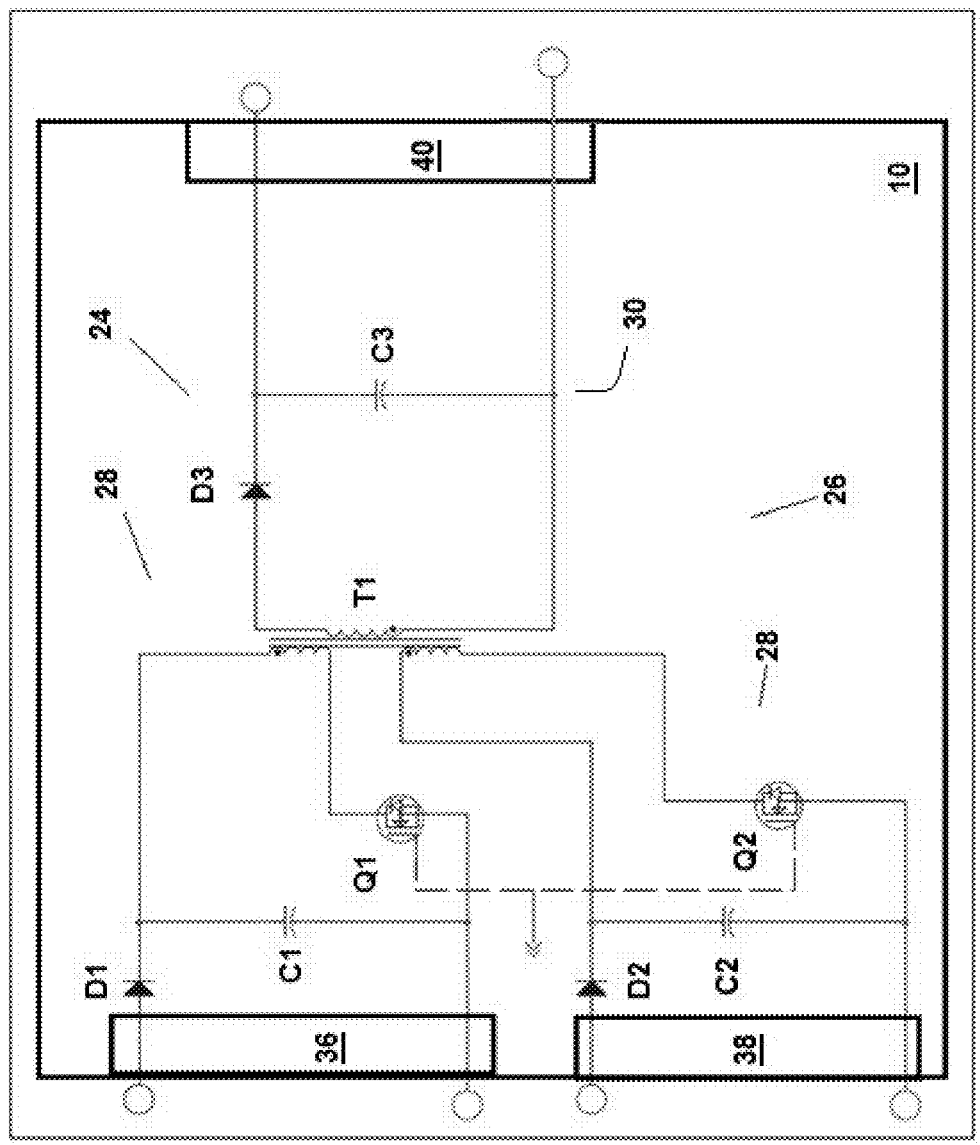
FIGS. 10-11 shows circuitry similar to that shown in FIG. 8 but with different topologies.

The embodiments shown in FIGS. 8-10 overcome this disadvantage by providing a way to, in effect, share the first and second transformers T1, T2. Instead of each power path 12, 14 having its own transformer T1, T2, each power path 12, 14 has a primary winding 44, 46 that couples to a common transformer T1. This shared transformer T1 couples both of the first stages 30 to the shared second stage 30. Since the transformers T1, T2 are physically quite large, sharing a transformer T1 as shown in FIGS. 5-7 offers a significant savings in space.

A byproduct of sharing the transformer T1 is that the first stages 30 of the first and second converters 24, 26 are no longer isolated from each other. As a result, it is no longer possible to automatically rely on small voltage differences at the first and second ac sources 16, 18 as a basis for choosing which of the first and second ac sources 16, 18 current will be drawn from for an extended period. Accordingly, this embodiment requires a slightly different approach to control.

The embodiment shown in FIG. 8 features a first transistor Q1 that controls current in a first primary winding 44 and a second transistor Q2 that controls current through a second primary winding 46. A single gate controller 41 controls both the first and second transistors Q1, Q2. As a result, the first and second transistors Q1, Q2 receive control signals concurrently. This is an important feature because it enables the first and second transistors Q1, Q2 to change state concurrently. As used herein, "concurrently" means an interval that is short enough so that the effect of a time difference is undetectable at the output 40. Since the first and second transistors Q1, Q2 work concurrently, the voltages on the hold-up capacitors C1, C2 are same, regardless of the input sources' conditions. As a result, the hold-up capacitors C1 and C2 work together and function effectively as a single large hold-up capacitance, regardless of the input sources' respective conditions.

Within the first stage 28, an element that is particularly likely to fail is the input electrolytic capacitor C1, which can be seen in FIG. 8 as being connected in parallel to the primary winding 44 and as also sustaining a maximum voltage that is equal to that of the first ac source 16.

To promote reliability, it is useful to replace the input electrolytic capacitor C1 with plural input capacitors C1-C7, each of which is connected to a primary winding of corresponding transformer T1-T7 with the primary windings cascaded and with the secondary windings of the transformers T1-T7 tied together.

Each capacitor C1-C7 sustains a voltage that is a fraction of the maximum voltage of the first ac source 16, the fraction being the reciprocal of the number of such capacitors C1-C7. As a result, the capacitors C1-C7 need not be rated to sustain a particularly high voltage.

An advantage of electrolytic capacitors is that the capacitor plates are highly variegated and thus offer considerable surface area for storage of charge within a small volume. This makes them particularly useful for power supplies, in which a space is at a premium and considerable amounts of charge must be stored. However, electrolytic capacitors are notoriously short-lived in part because the insulation between the plates dries out over time.

The configuration shown in FIG. 9 permits the notoriously unreliable electrolytic capacitors C1, C2 shown in FIG. 8 to be replaced with more reliable ceramic capacitors. This results in a more reliable and long-lived first stage 28.

An additional advantage of the first stage 28 shown in FIG. 9 is that individual transformers T1-T7 are much smaller than the transformer T1 shown in FIG. 8. This is useful because machines that pick and place components onto a printed-circuit board are better suited for manipulating smaller components.

Figure 11:
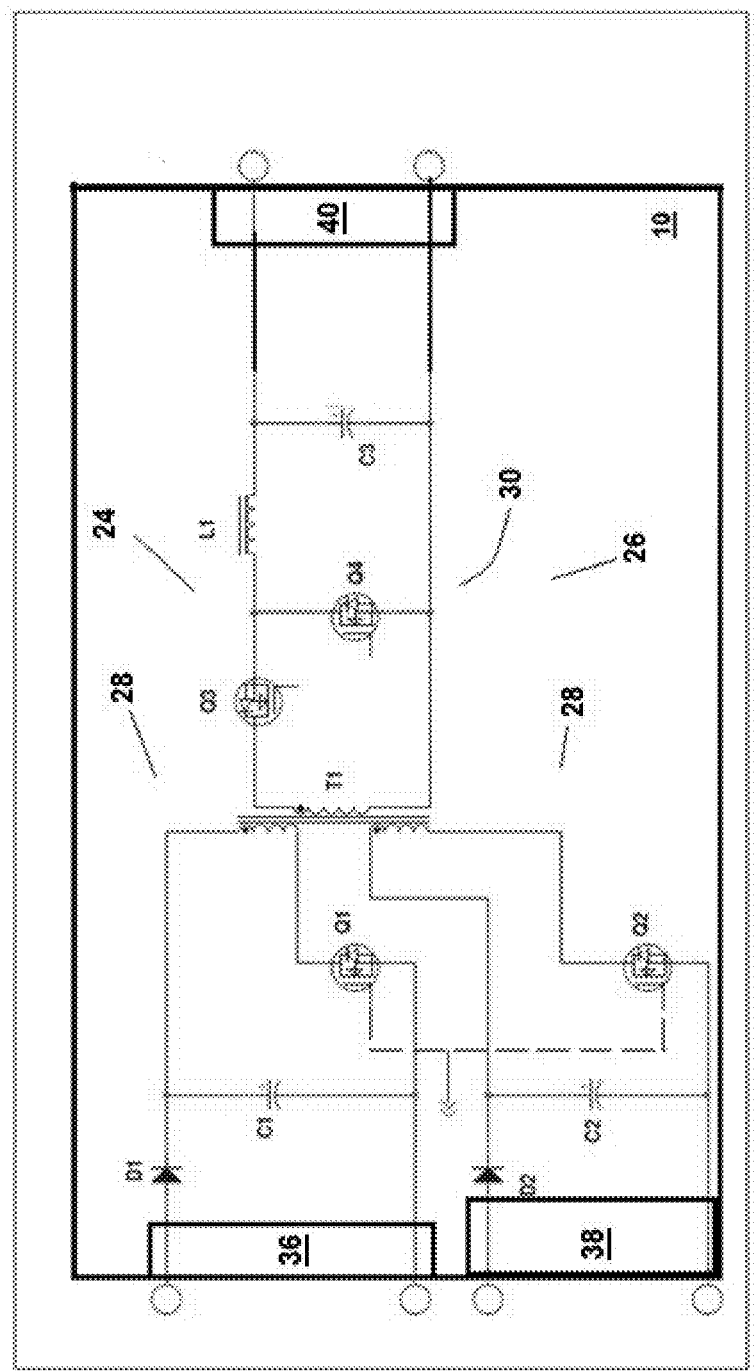

FIGS. 10 and 11 shows a configuration similar to that shown in FIG. 8 but with the circuitry between the transformer T1 and the second stage 30 having a flyback topology and a forward topology, respectively, instead of the fly-forward topology shown in FIG. 8.

In all embodiments shown in FIGS. 8, 10, and 11, the respective states of the first and second input transistors Q1, Q2 will depend on the availability of the first and second ac sources 16, 18. If both the first and second ac sources 16, 18 are available, the first and second transistors Q1, Q2 will be in opposite states, with one being conductive and the other being non-conductive will be in a conducting state while the other will be in a non-conductive state.

Figure 12:
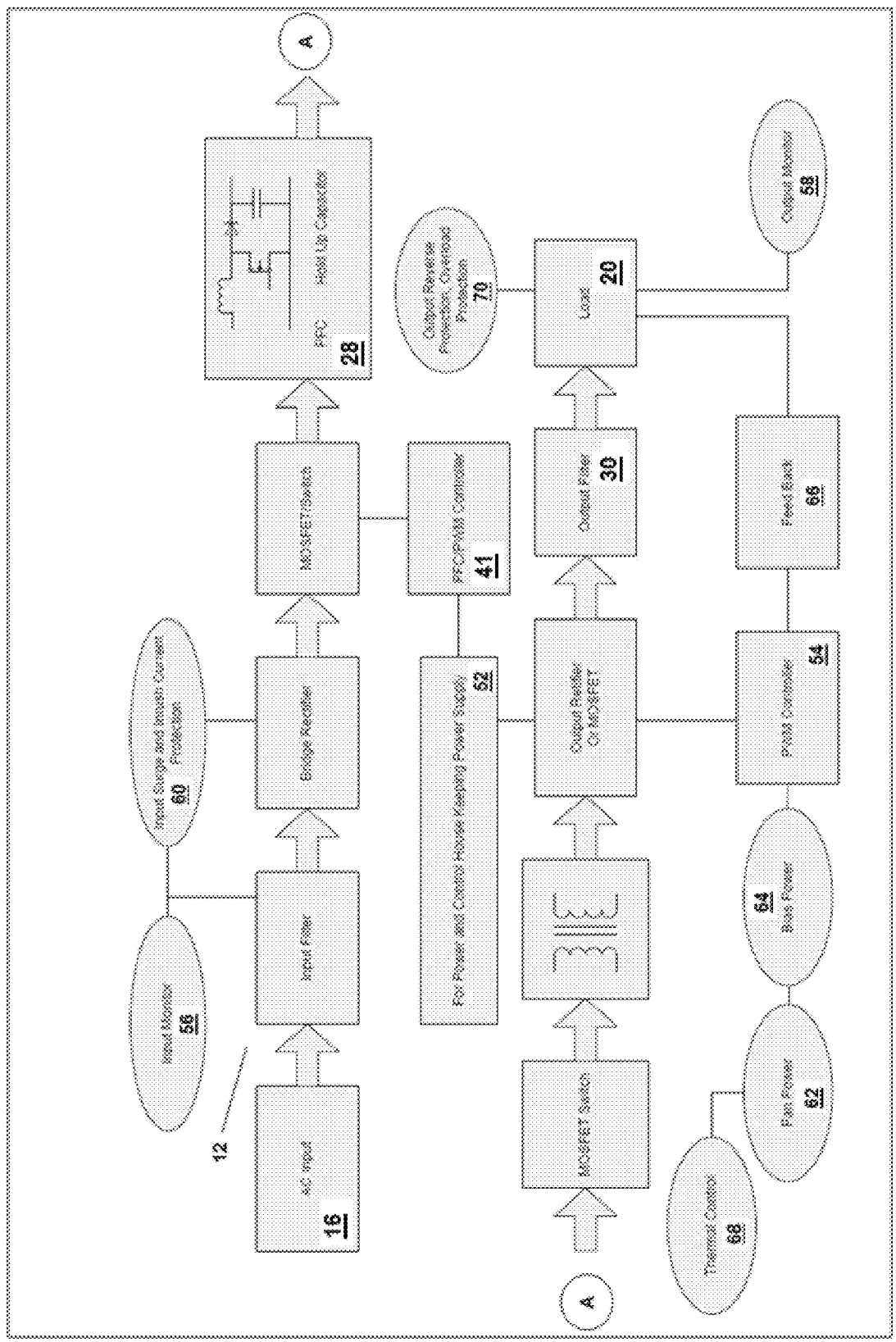
FIG. 12 shows function blocks for one of two ac/dc power supplies that are within one package identifying certain function blocks that can be shared between them.

FIG. 12 shows various components that are associated with but not part of a power path 12. A number of these components are susceptible to being shared between first and second power paths 12, 14. By sharing one or more of these components, it is possible to reduce part count of the overall power supply 10 as well as to increase its power density.

In some embodiments, the power supply 10 comprises internal components that are not along the power path itself. These include various controllers, such as the gate controller 41 and a PWM controller 54, input monitoring circuitry 56, output monitoring circuitry 58, surge-protection circuitry 60, a fan power supply 62 for providing a dc voltage, usually twelve volts, to power a fan motor, a bias power supply 64 for providing a constant dc voltage, usually five volts, for use by any other digital circuitry that may be used within the data center, feedback circuitry 66 that connects to the load 20, a thermal sensor 68 for monitoring the fan's operating temperature and providing an input for adjusting the fan motor's duty cycle, and overload protection circuitry 70 connected to the output 40.

In some embodiments, the first and second power paths 12, 14 share the housekeeping circuitry 52 that provides power to one or more of the foregoing components. Embodiments include those in which the housekeeping circuitry 52 is split between primary and secondary sides of a transformer that couples the first and second stages 28, 30.

Figure 13:
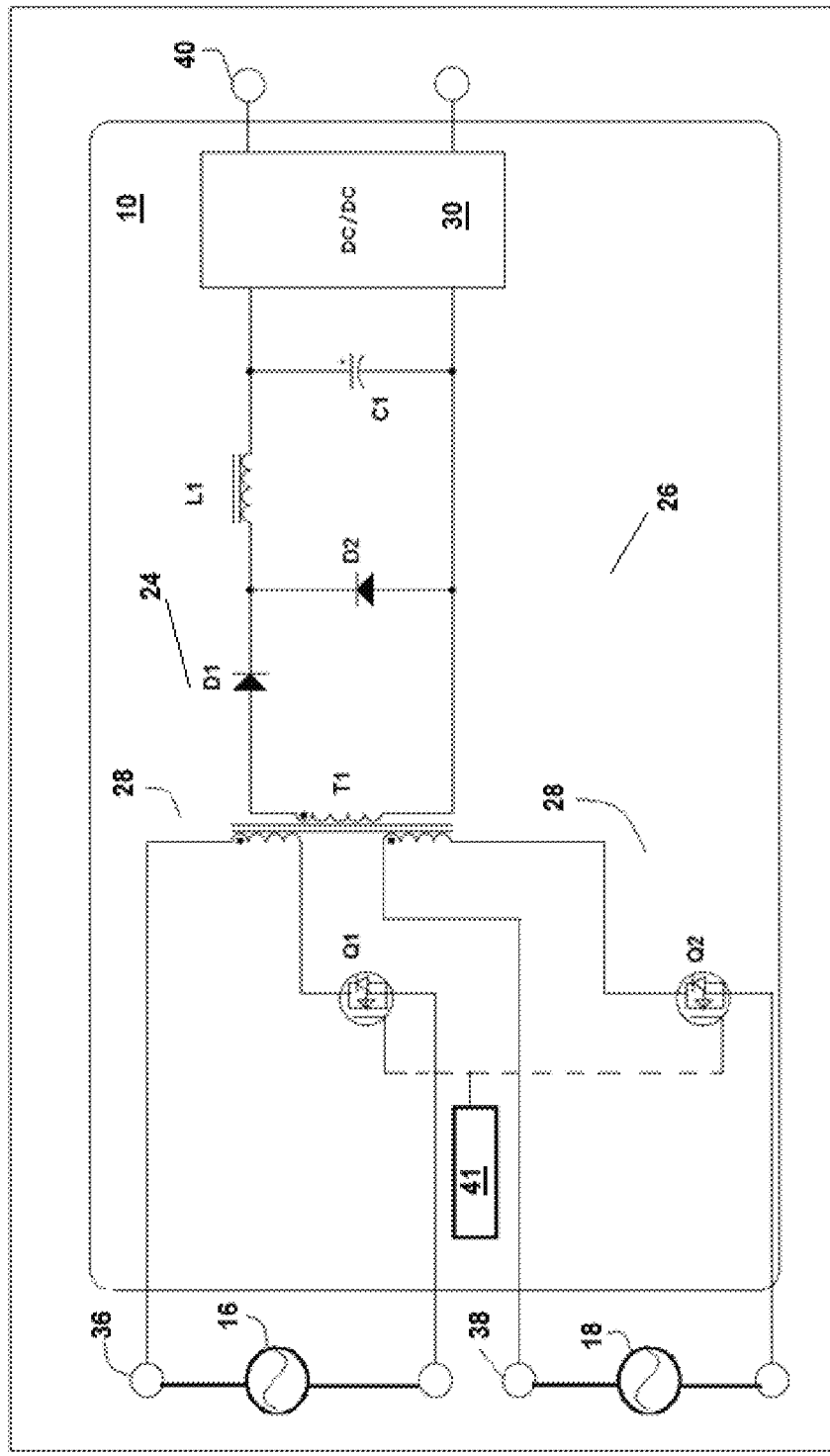
FIGS. 13-15 show embodiments in which power-factor correction circuits share a common transformer.
Figure 14:
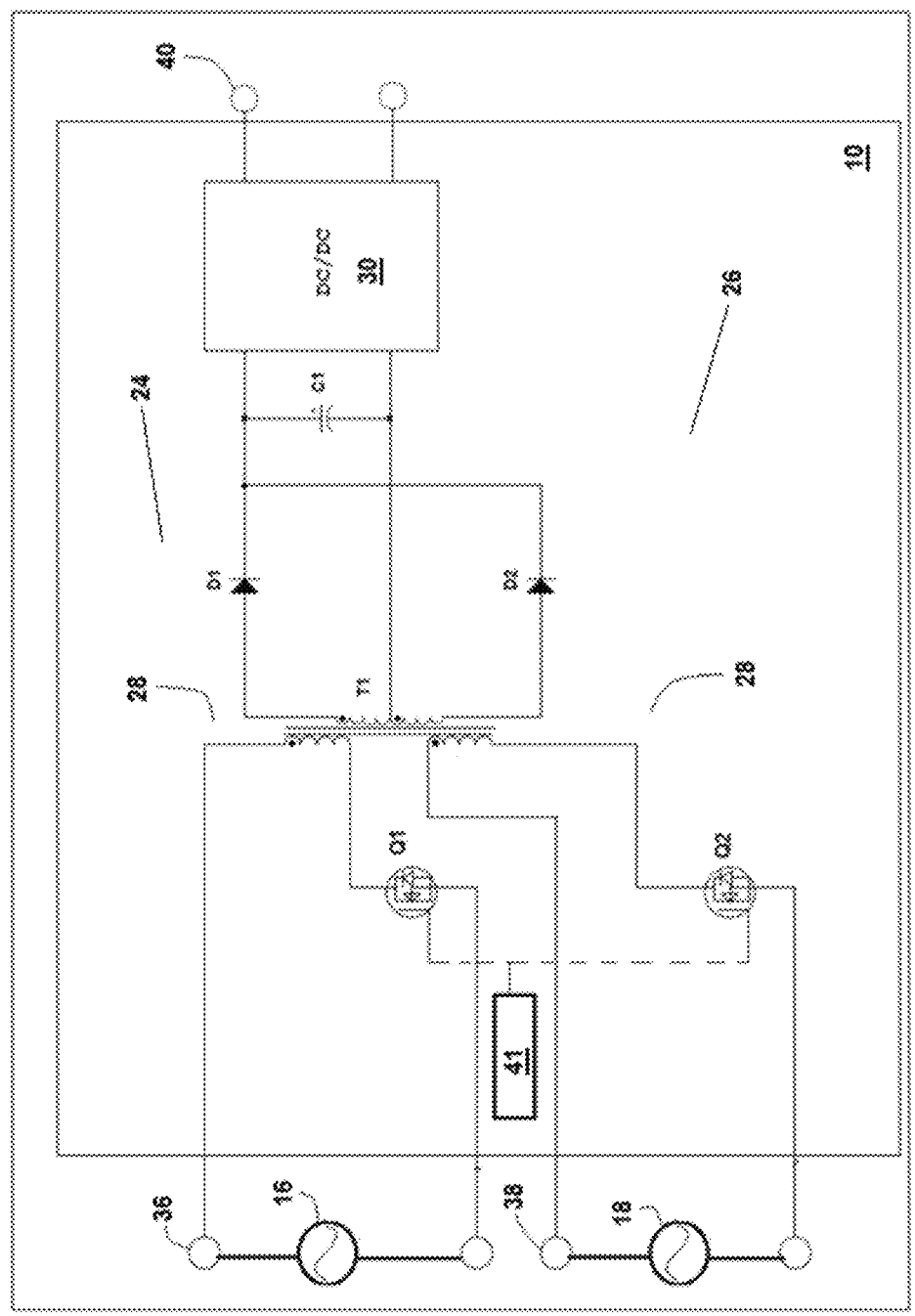
Figure 15:
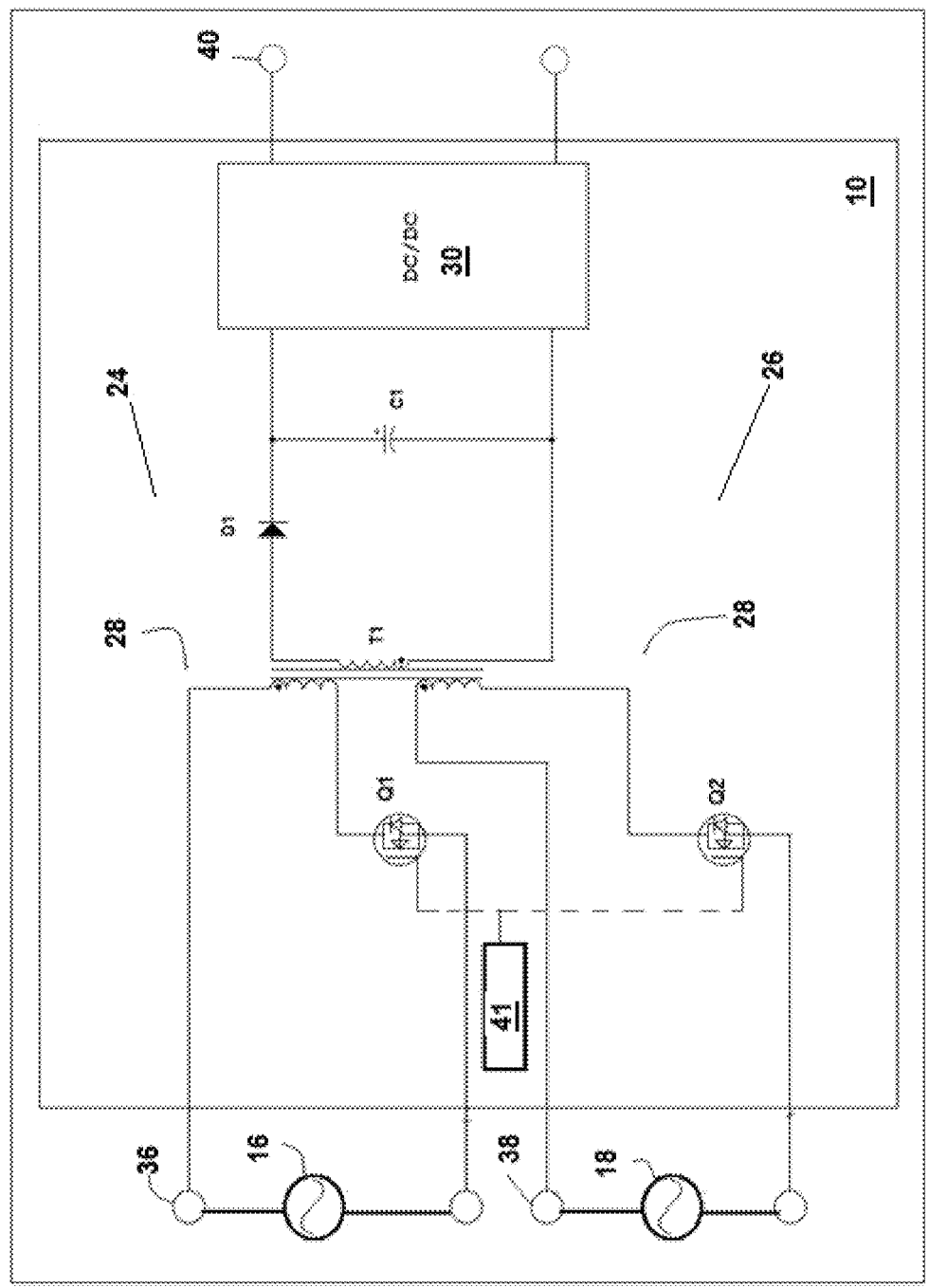

In the embodiments of FIGS. 13-15, the first and second power paths 12, 14 share a common transformer T1 and a common second stage 30. Depending on the topology of diodes D1, D2 between the transformer T1 and the second stage 30, the first stage 28 has a forward topology, as shown in FIG. 13, a fly-forward topology, as shown in FIG. 14, or a flyback topology, as shown in FIG. 15.

In the embodiments shown in FIGS. 13-15, the respective states of the first and second input transistors Q1, Q2 will depend on the availability of the first and second ac sources 16, 18. If both the first and second ac sources 16, 18 are available, the first and second transistors Q1, Q2 will be in opposite states, with one being conductive and the other being non-conductive will be in a conducting state while the other will be in a non-conductive state.

Figure 16:
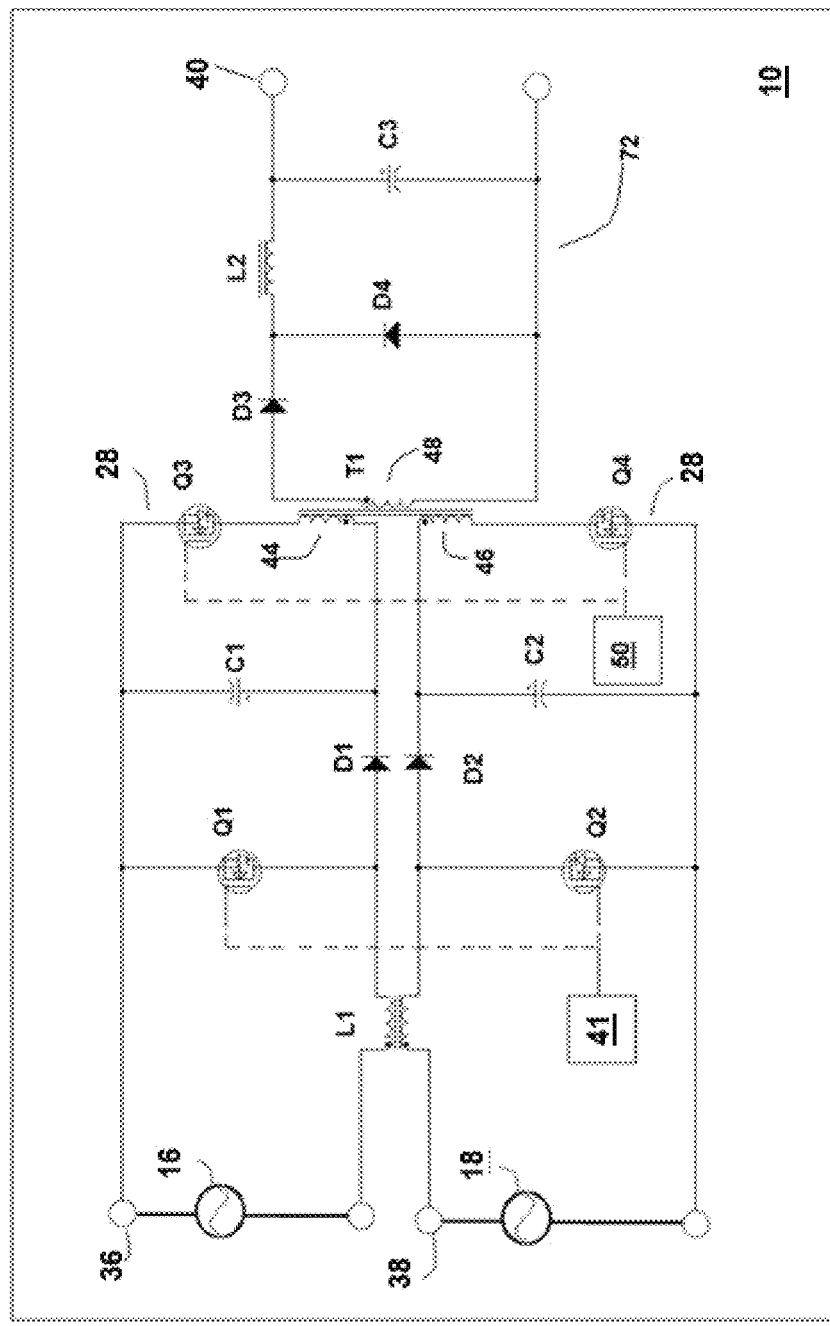
FIGS. 16-18 show embodiments in which power-factor correction circuits share a common inductor core, a dc/dc converter, including the magnetic core of its transformer, and a hold-up capacitance that is formed by a pair of capacitors that, as a result of the circuit topology, effectively function as a single capacitor.
Figure 17:
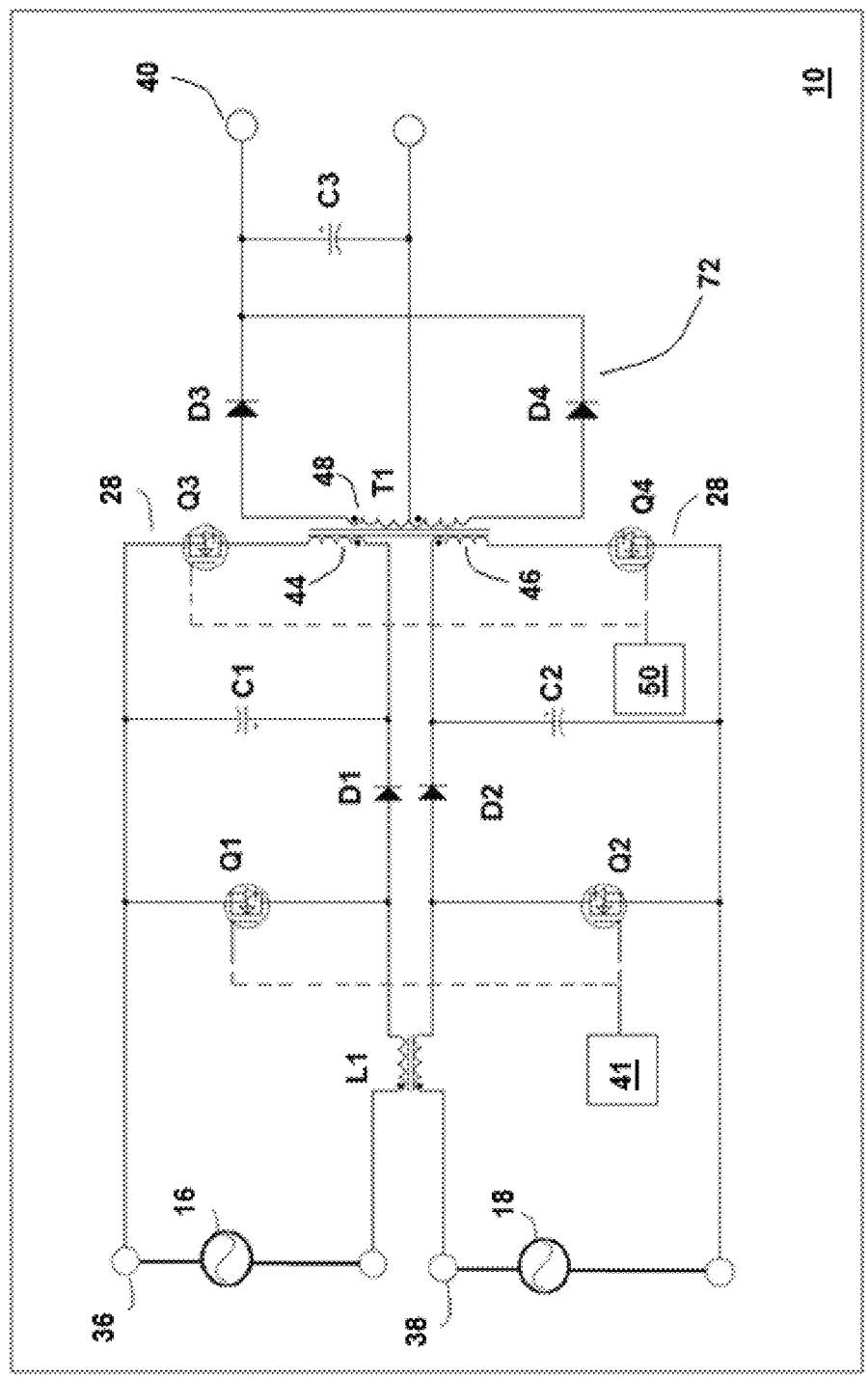

FIG. 16 shows a first ac source 16 that is coupled to a first power path 12 and a second ac source 18 that is coupled to a second power path 14. Each of the first and second power paths 12, 14 has a corresponding first stage 28 to which a corresponding one of the first and second ac sources 16, 18 is coupled. An inductor L1 couples the first stages 28 of the first and second power paths 12, 14 to each other. As a result, the first stages 28 are not isolated from each other.

The first power path's first stage 28 has a first power-path primary winding 44 and a corresponding first-power-path output capacitor C1. The first power-path output capacitor C1 is connected parallel to the first-power-path primary winding 44.

The first power path's first stage 28 also has a first power-path input transistor Q1 and a first-power-path output transistor Q3. The first power-path input transistor Q1 connects to the negative side of the first-power-path primary winding 44 by way of the first-power-path output transistor Q3 and to the positive side of the first-power-path primary winding 44 by way of a first power-path diode D1 that is biased to permit current from the inductor L1 to the first-power-path primary winding 46.

The second power path's first stage 28 has a second power-path primary winding 46 and a corresponding second-power-path output capacitor C2. The second power-path output capacitor C2 is connected parallel to the second-power-path primary winding 46.

The second power path's first stage 28 also has a second power-path input transistor Q2 and a second-power-path output transistor Q4. The second power-path input transistor Q2 connects to the negative terminal of the second-power-path primary winding 46 by way of the second-power-path output transistor Q4 and to the positive terminal of the second-power-path primary winding 46 by way of a second-power-path diode D2 that is biased to permit current from the inductor L1 to the second-power-path primary winding 46.

A first controller 41 controls the gate of the first power-path input transistor Q1 and the gate of the second-power-path input transistor Q2. The respective states of the first-power-path input transistor Q1 and the second-power-path input transistor Q2 depend on the availability of the first and second ac sources 16, 18. If both the first and second ac sources 16, 18 are available, the first-power-path input transistor Q1 and the second-power-path input transistor Q2 will be in opposite states in which one is in a conducting state and the other is in a non-conducting state. Since the first controller 41 controls the gates of both transistors Q1, Q2, it is possible to reliably cause both transistors Q1, Q2 to transition between conductive and non-conductive states at substantially the same time.

A second controller 50 controls the gate of the first power-path output transistor Q3 and the gate of the second-power-path output transistor Q4. This permits concurrent control of the first power-path output transistor Q3 and of the second-power-path output transistor Q4.

In the embodiments of FIGS. 16-19, two first stages 28 of the first and second power paths 12, 14 share a common inductor core L1, and a transformer T1. While it may not be immediately apparent, the novel topology of the first and second power paths 12, 14, and in particular, the concurrent operation of the output transistors Q3, Q4, causes the first power-path output capacitor C1 and the second-power-path output capacitor C2 to work together to form what is effectively a single hold-up capacitor that is shared by both of the two first stages 28. This shared hold-up capacitor is formed by the combination of the first power-path output capacitor C1 and the second-power-path output capacitor C2.

The illustrated topology forms a shared hold-up capacitor by clamping the voltages across the first power-path output capacitor C1 and the second-power-path output capacitor C2 to each other. This causes the first and second power paths 12, 14 to, in effect, share what is electrically the equivalent of a single hold-up capacitor that is formed by the first power path's output capacitor C1 and the second power path's output capacitor C2. This virtual hold-up capacitor holds enough charge to support current during the brief interval required to transition from the state in which both of the first and second ac sources 16, 18 are available and the state in which power is available from only one of the first and second ac sources 16, 18.

Because the output capacitors C1, C2 effectively form a single capacitor, the first stages 28 of the first and second power paths 12, 14 effectively share a common hold-up capacitor. As a result, the output capacitors C1, C2 can be made half as large as they would have had to be had they not been configured to cooperate as a single hold-up capacitor.

Figure 18:
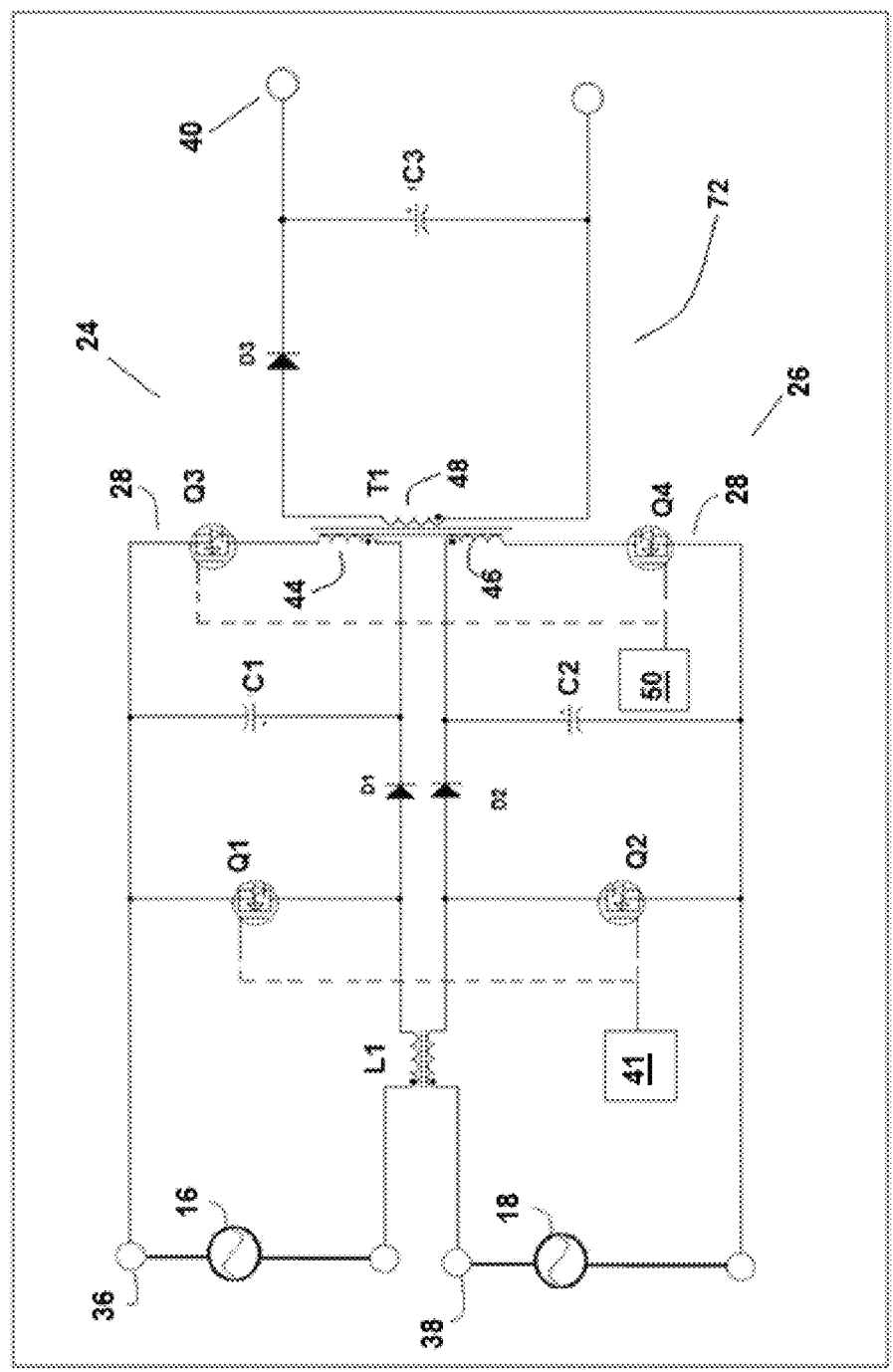
Figure 19:
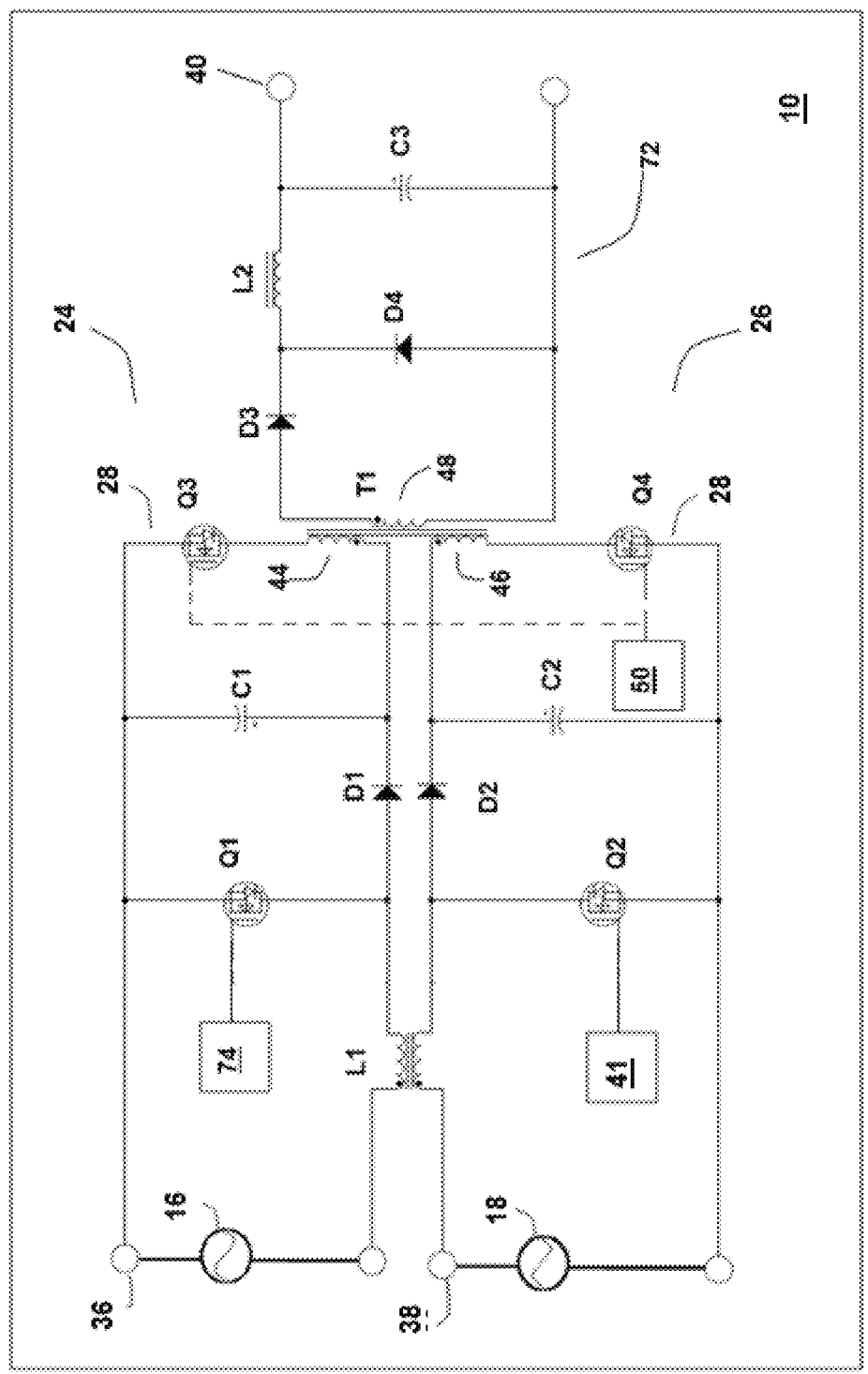
FIG. 19 is similar to FIG. 18 but with separate controllers for the input transistors.
Figure 20:
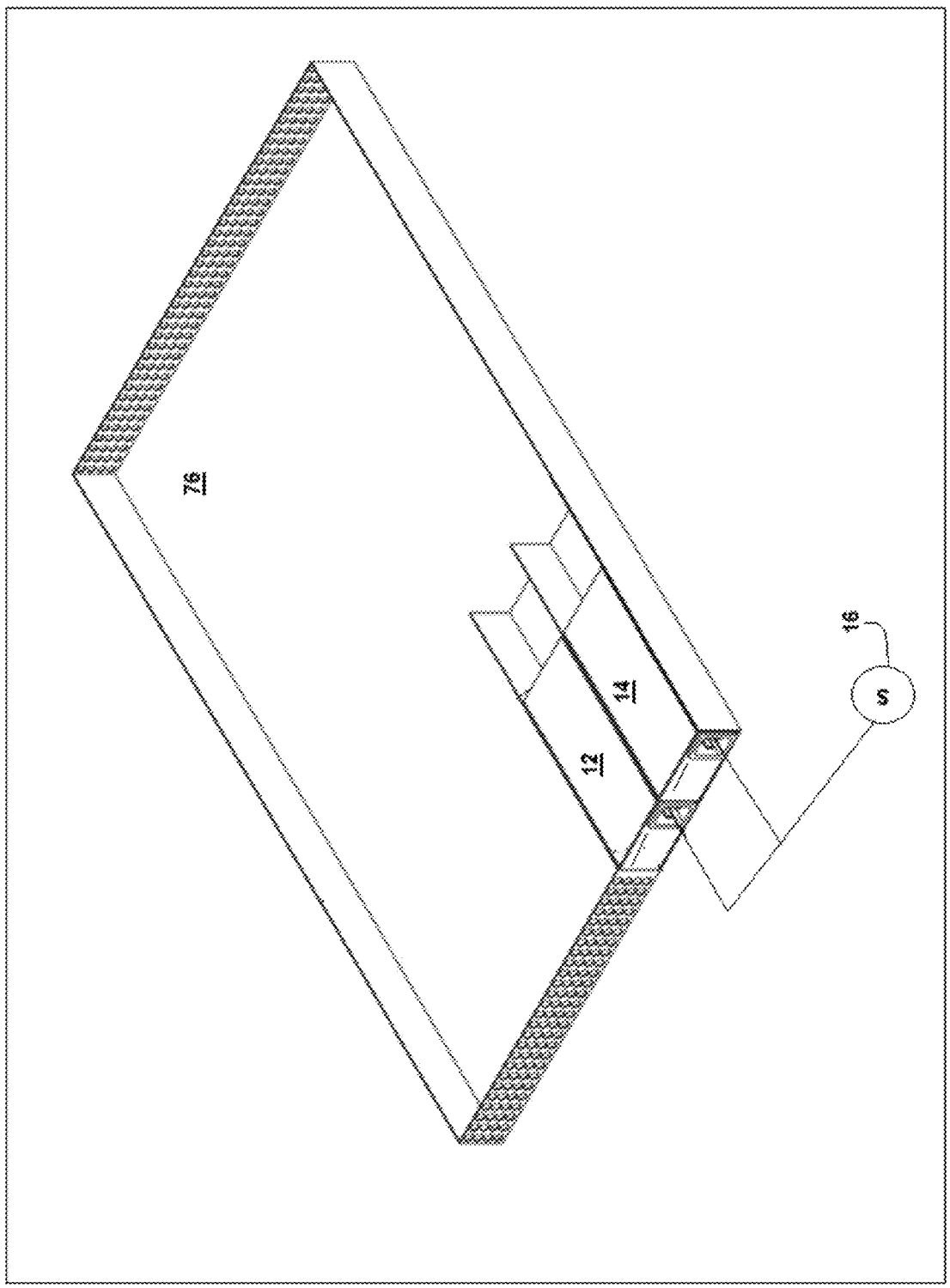
FIG. 20 shows a stand-alone server with first and second power paths connected to a common ac source.

FIG. 18 also shows downstream circuitry 72 that extends between the secondary winding 48 of the transformer T1 and the power supply's output 40. In FIG. 18, the downstream circuitry 72 is configured with a forward topology. FIG. 19 shows an embodiment identical to that if FIG. 18 but with the downstream circuitry 72 having been configured with a fly-forward topology. FIG. 20 shows an embodiment identical to that if FIG. 18 but with the downstream circuitry 72 instead having been configured with a fly-flyback topology.

FIG. 19 shows an embodiment similar to that shown in FIG. 18 but with the first controller 41 controlling only the second power-path input transistor Q2. A third controller 74 controls the first-power-path input transistor Q1.

In the embodiment shown in FIG. 19, the states of the first-power-path input transistor Q1 and the second power-path input transistor Q2 depend on the availability of the first and second ac sources 16, 18. If only one the first ac source 16 is available, then only the first-power-path input transistor Q1 will be in a conducting state. If only the second ac source 18 is available, then only the second power-path input transistor Q2 will be in a conducting state. If both the first and second ac sources 16, 18 are available, the first-power-path input transistor Q1 and the second power-path input transistor Q2 will be in opposite states with one being in a conducting state and the other being in a non-conducting state. The choice of which one is in a conducting state and which one is in a non-conducting state is arbitrary.

The architectural principles set forth in connection with FIGS. 1-4 are applicable to a dual-input power supply 10 in which both inputs are connected to the same ac power source 16. As an example, FIG. 20 shows a stand-alone server 76 with two power supplies operating in tandem, each of which connects to the same ac power source 16. The two power supplies continue to define first and second power paths 12, 14, each of which comprises first and second stages 28, 30 as already described above. The main distinction is that the first and second power paths 12, 14 connect to the same ac source 16.

Because the lifetime of a conventional power supply is less than that of the stand-alone server 76 to which it supplies power, it is expected that at some point, the first power path 12 will fail. In such cases, the second power path 14 can carry the burden of supplying power by itself, but only for a limited period. Failure of the first power path 12 thus triggers an alert to a human operator, who then hot-swaps the failed first power path 12 with a new first power path 12.

Within a power supply 10, the expected lifetimes of the various components are not identical. In fact, the second stage 30, which comprises the dc/dc converter, has a much longer expected lifetime than the first stage 28, which comprises the power-factor correction circuit.

Figure 21:
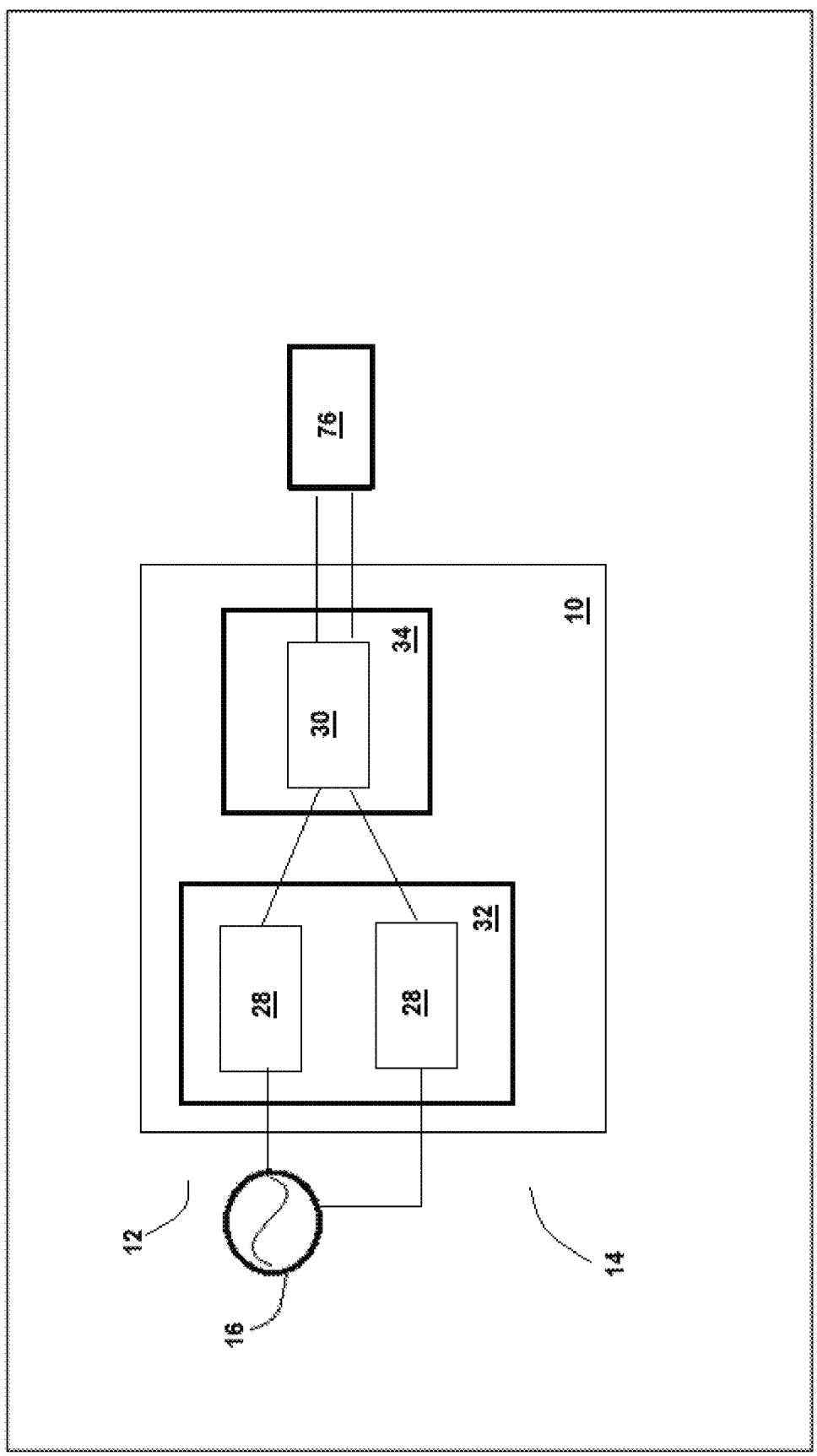
FIG. 21 shows an exemplary architecture for a dual-path power supply that supplies power to a stand-alone server.

Given the differential in expected lifetimes, it is useful to provide the stand-alone server 76 with an architecture along the lines of that shown in FIG. 21, in which the first stage 28 is within its own first package 32 and the second stage 30 is within its own second package 34. This permits the first package 32 to be hot-swapped independently of the second package 34.

Figure 22:
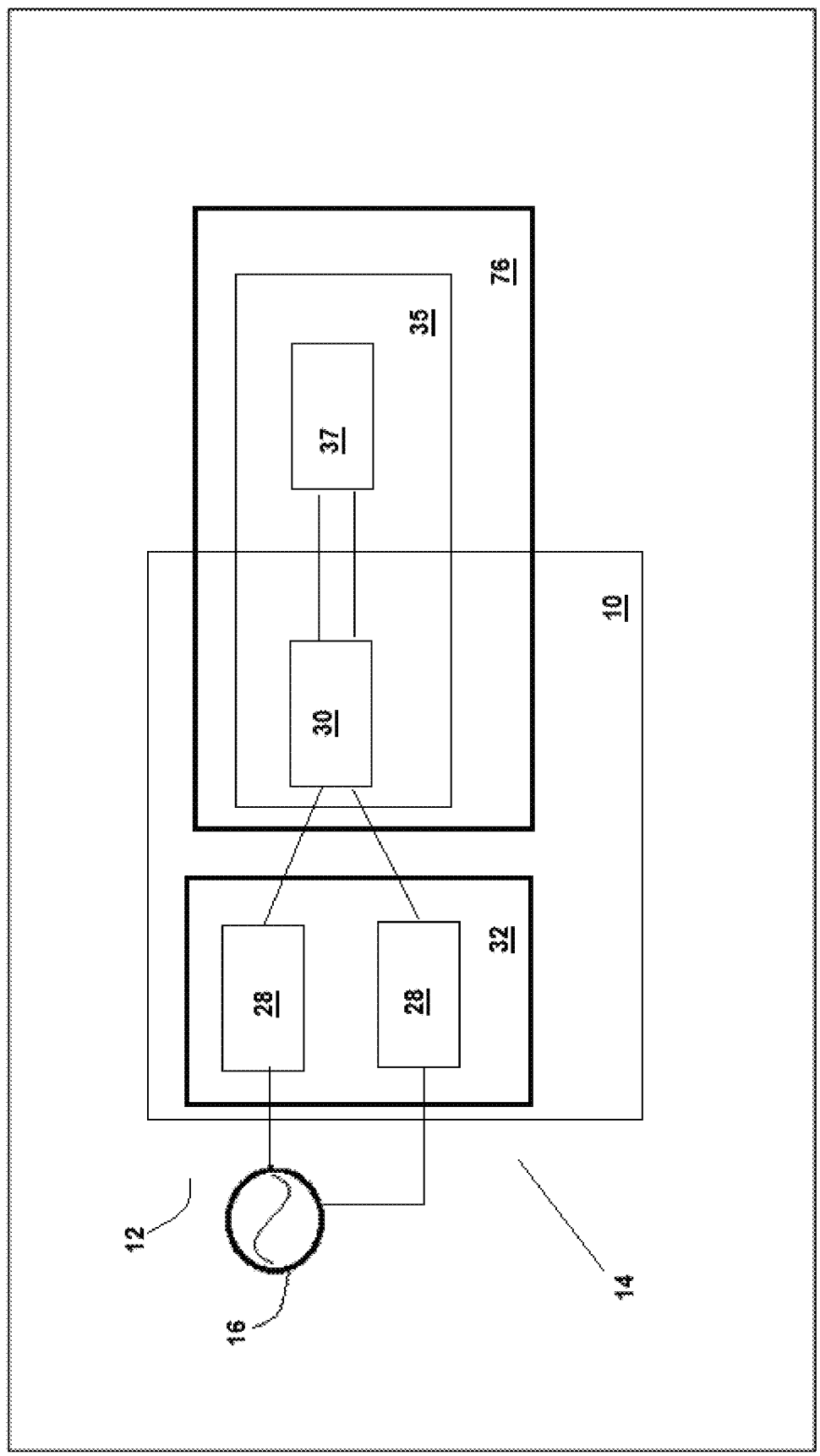
FIG. 22 shows an architecture similar to that shown in FIG. 21 but with the second stage being on the motherboard of the stand-alone server.

Because the expected lifetime of the second package 34 is comparable to that of the stand-alone server 76, it is useful to modify the architecture shown in FIG. 21 to place the second stage 30 directly on the motherboard 35 of the stand-alone server 76, as shown in FIG. 22. In this case, only the first stage 28 is in its own package 32 since it is only the first stage 28 that may need to be replaced.

In a passively-cooled power supply 10, the expected lifetime of the first stage 28 approaches that of the stand-alone server 76 to which it supplies power.

As used herein, a passively-cooled power supply 10 is one that relies, in normal operation, primarily on conduction of heat from power-handling units rather than from a fan. Such a power supply 10 can include a fan for use in emergencies, with the fan being controlled by a controller that receives a temperature signal from a heat sensor. However, in such a power supply 10, years can go by without the fan ever having to be turned on.

Figure 23:
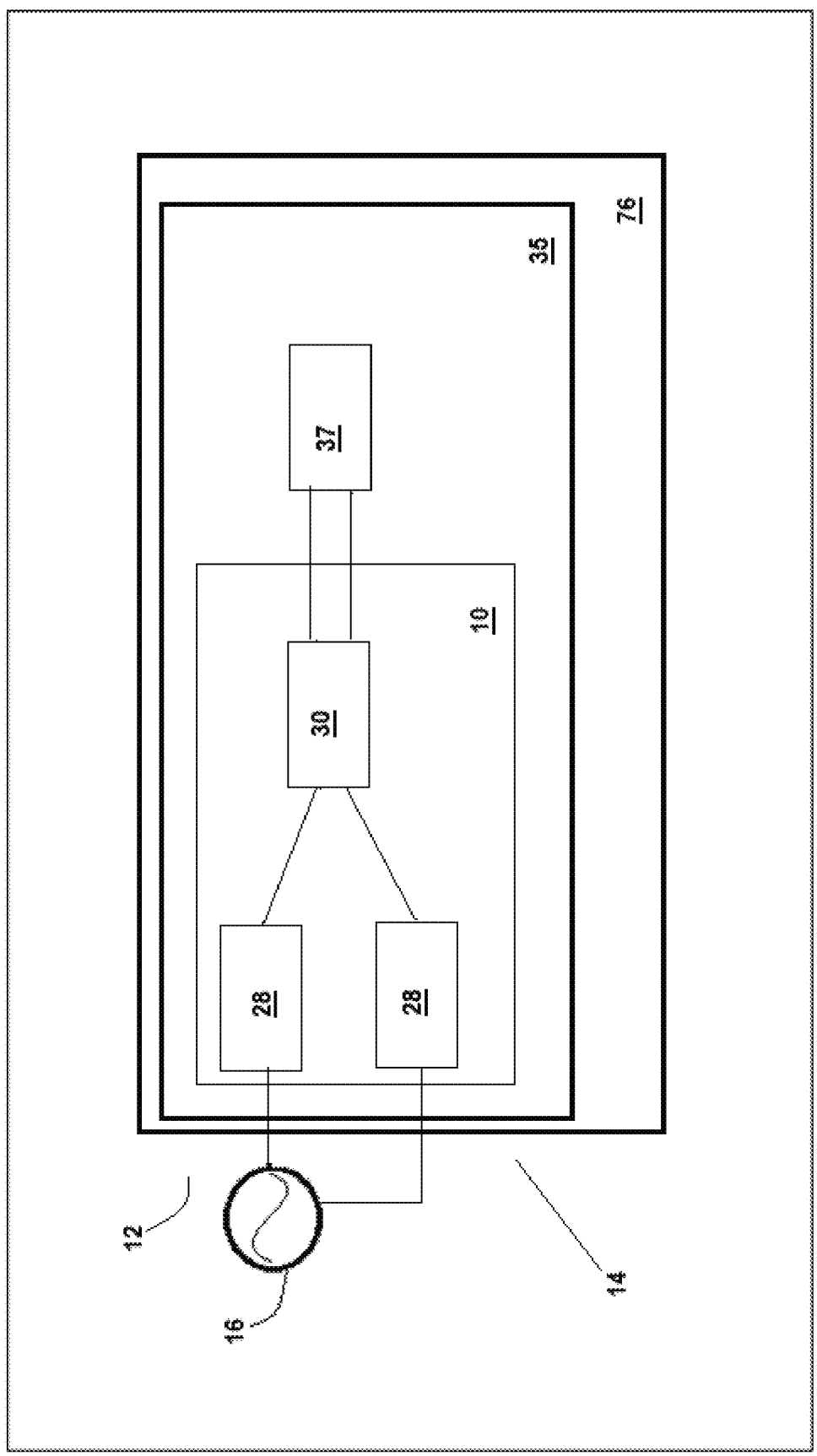
FIG. 23 shows an architecture similar to that shown in FIG. 22 but with the first and second stages both being on the motherboard of the stand-alone server.

In such cases, where the expected lifetime of the first stage 28 is sufficiently long, an architecture similar to that shown in FIG. 23 is useful. In this architecture, the first stage 28 and second stage 30 are both on the motherboard 35 of the stand-alone server 76.

Figure 24:
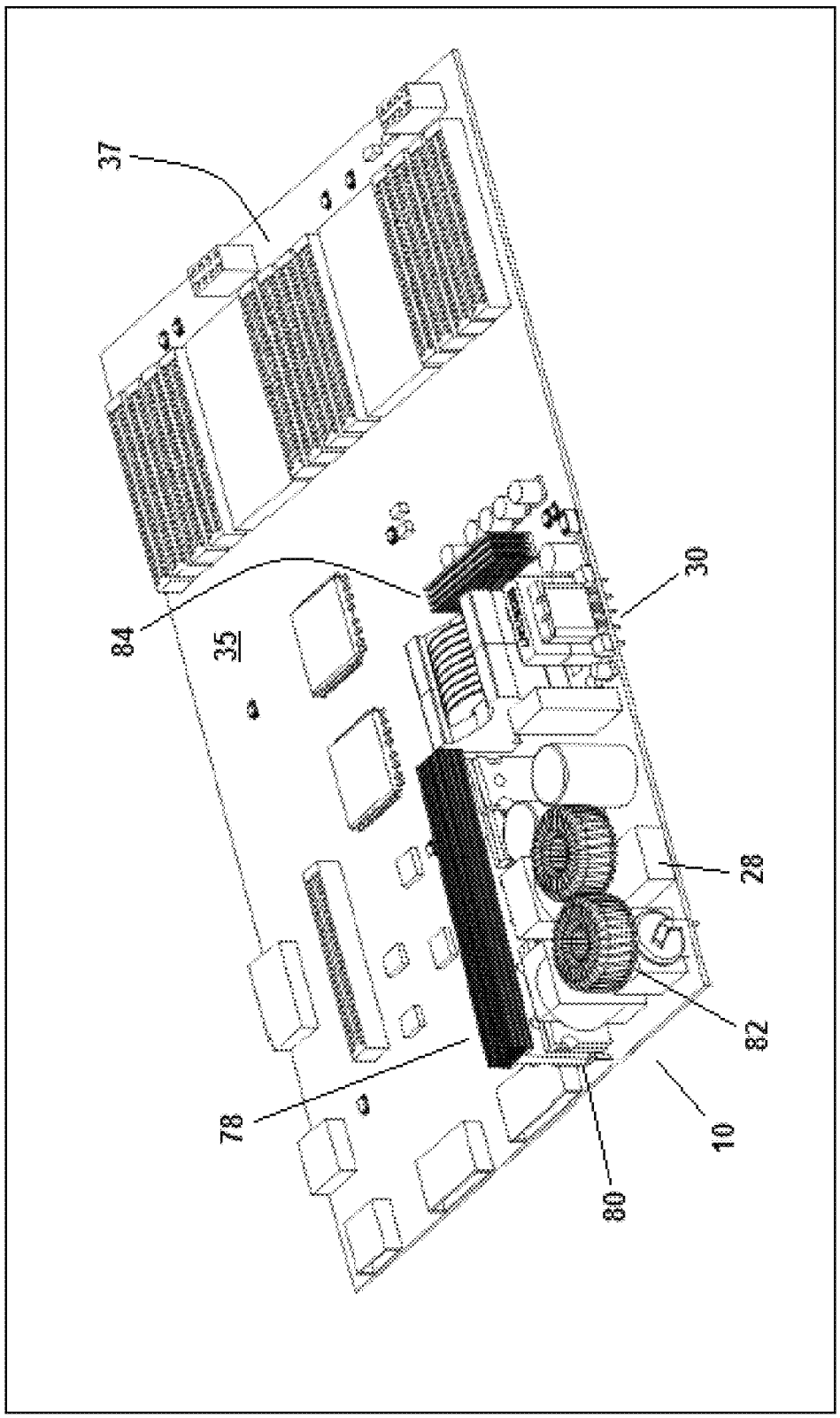
FIG. 24 shows an isometric view of a motherboard with a power supply mounted thereon.

An isometric view of a typical motherboard 35 with a power supply 10 mounted thereon can be seen in FIG. 24. Since the power supply 10 generates considerable heat during operation, it is useful to provide a first heat sink 78 in thermal communication with the switches 80 and transformers 82 of the first stage 28 and a second heat sink 84 in thermal communication with the second stage 30.

An embodiment as shown in FIGS. 23 and 24 is particularly useful because the power supply 10 no longer needs to be designed as a hot-swappable module. Placement of the first and second stages 28, 30 on the motherboard 35 thus reduces space required to accommodate the circuitry and also reduces costs.

A motherboard 35 normally contains circuitry 37 that does not operate at high temperatures. As a result, those who handle motherboards 35 do so with the expectation that the circuitry 37 is relatively safe to handle.

The inclusion of the power supply 10 on the motherboard 35 as shown in FIG. 23 changes this. Circuitry associated with a power supply 10 operates at elevated temperatures and at high voltages, thereby raising the average operating temperature of circuitry on the motherboard 35. Moreover, a power supply's rapid switching and high current levels combine to cause considerable electromagnetic interference. This can interfere with nearby circuitry 37 on the motherboard 35. As a result, it is useful to include additional components to provide some protection against both of these hazards.

Figure 25:
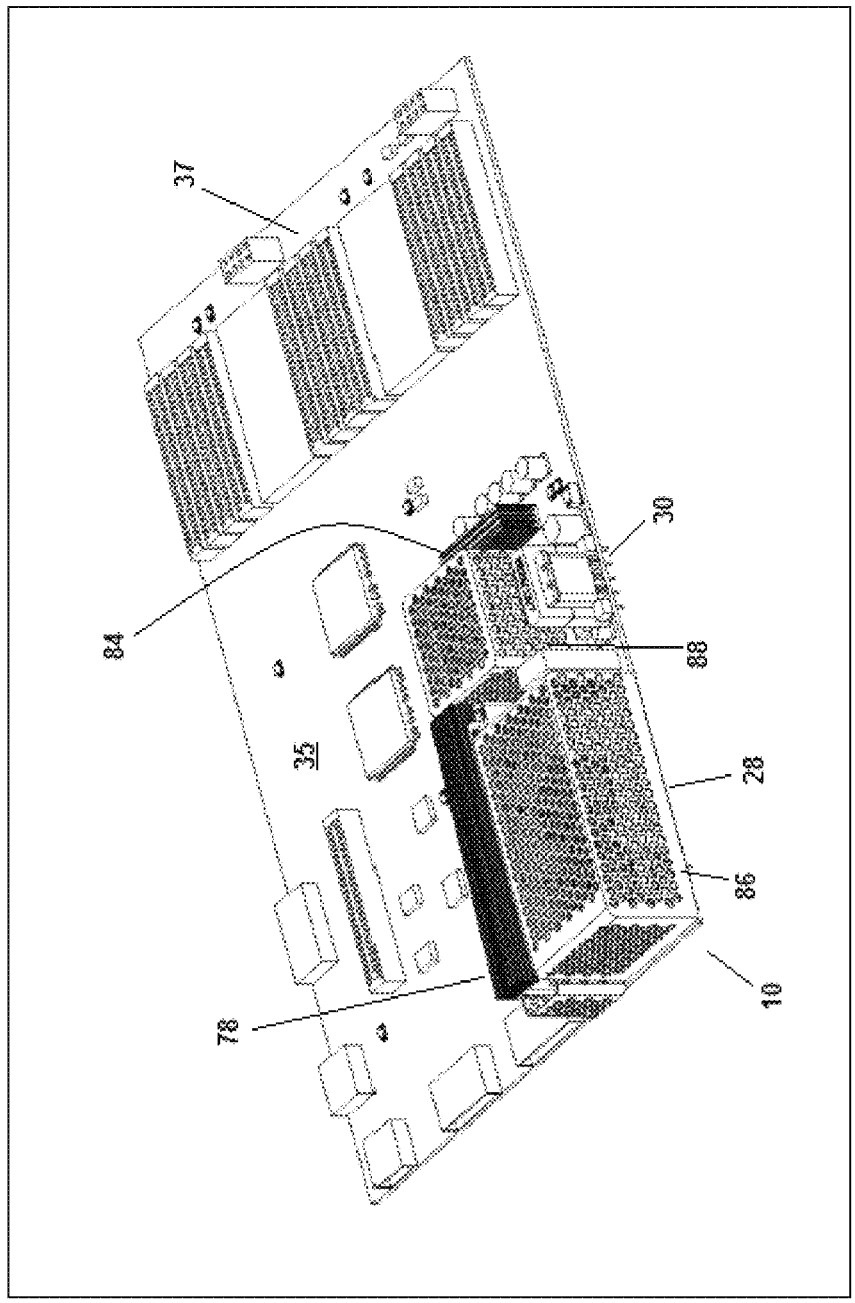
FIG. 25 shows the power supply of FIG. 24 with shields disposed around the pair of first stages and the second stage.

FIG. 25 shows the motherboard 35 shown in FIG. 24 but with the first stage 28 and second stage 30 having been shielded by corresponding first and second shields 86, 88. In the illustrated embodiment, the first shield 86 is a grounded EMI shield that protects the load circuitry 37 against interference and also protects service personnel from shock and from inadvertently touching the components of the first stage 28. The second shield 86 is a heat shield that protects service personnel from inadvertently touching the components of the second stage 30.

In the foregoing embodiments, the power supply 10 has been shown to receive power from one or more ac sources 16, 18. However, in some embodiments, the power supply 10 receives dc power from one or more dc sources. Such dc sources are typically maintained at a high voltage, such as two hundred to four hundred volts. In such embodiments, the dc power essentially passes through the first stage 28 and maintains a voltage at a hold-up capacitor that provides a voltage for the second stage 30, which comprises the dc/dc converter.

It is to be understood that the foregoing description is intended to illustrate and not to limit the scope of the invention, which is defined by the scope of the appended claims. Other embodiments are within the scope of the following claims.

The invention claimed is:

1. An apparatus comprising a dual-input power supply for providing power to a load comprising IT equipment that has a motherboard having load circuitry thereon, said power supply comprising a first power path, wherein said first power path connects electrical power to said load, wherein said power path comprises a first stage that comprises a power-factor correction circuit and a second stage that comprises a dc/dc converter, wherein said first stage is disposed either within a package that is off said motherboard or without a package and on said motherboard, wherein said second stage is disposed either within a package that is off said motherboard or without a package and on said motherboard, wherein said power supply comprises a second power path that connects a second input of said dual-input power supply to said load, wherein said second power path comprises a first stage comprising a power-factor correction circuit, wherein said second stage is common to both said first and second power paths, wherein said first stages of said power paths collectively define a pair of first stages that is disposed either within said package that is off said motherboard or without a package and on said motherboard, wherein each of said first stages comprises a winding and a capacitor that is parallel to said winding, and wherein said first stages are configured to cause said capacitors to cooperate to form a single hold-up capacitor that is shared by both said first and second power paths.

2. The apparatus of claim 1, wherein said package is insertable between said electrical power and said motherboard, wherein said pair of first stages is disposed within said package, and wherein said second stage is disposed or packaged alone on said motherboard along with said load circuitry.

3. The apparatus of claim 1, wherein said pair of first stages and said second stage are both disposed on said motherboard along with said load circuitry and wherein said second stage is disposed on said motherboard with or without a package.

4. The apparatus of claim 1, wherein said electrical power comprises dc power and wherein, when said power supply is connected to said dc power, said first stage is bypassed.

5. The apparatus of claim 1, wherein said first stage comprises capacitors and transformers, that collectively sustain a voltage equal to that provided by a source of said electrical power, wherein each of said capacitors sustains a fraction of said voltage, wherein each of said capacitors is connected across a primary winding of a corresponding one of said transformers, wherein said primary windings are cascaded, and wherein secondary windings of said transformers are tied together such that said second stage receives a voltage that is the sum of that across each of said capacitors.

6. The apparatus of claim 1, further comprising first and second heat sinks, wherein said first heat sink is disposed on said motherboard so as to be in thermal communication with said pair of first stages and wherein said second heat sink is disposed on said motherboard so as to be in thermal communication with said second stage.

7. The apparatus of claim 1, further comprising first and second heat shields disposed on said motherboard to prevent a user from inadvertently coming into contact with said pair of first stages and said second stage, respectively, wherein said first heat shield is disposed to cover said pair of first stages and said second heat shield is disposed to cover said second stage.

8. The apparatus of claim 1, further comprising first and second electromagnetic-interference shields disposed on said motherboard disposed to prevent electromagnetic interference from said pair of first stages and from said second stage from interfering with circuitry on said motherboard, wherein said first electromagnetic-interference shield is disposed to electromagnetically isolate said pair of first stages and wherein said second electromagnetic-interference shield is disposed to electromagnetically isolate said second stage.

9. The apparatus of claim 1, wherein said electrical power comprise first and second power sources that operate independently of each other, wherein said second power path maintains a connection between said second power source and said IT equipment while said second power source has sustained a fault that prevents said second power source from providing power, wherein said first power path maintains a connection between said first power source and said IT equipment while said first power source has sustained a fault that prevents said first power source from providing power, wherein said power supply retains the same configuration regardless of how many of said power sources are operational, and wherein said first stages are isolated from each other.

10. The apparatus of claim 1, wherein said first and second power paths share a common transformer.

11. The apparatus of claim 1, wherein said first and second power paths share a common inductor.

12. The apparatus of claim 1, wherein said first and second power paths share a common hold-up capacitor.

13. The apparatus of claim 1, wherein said apparatus is configured for providing continuity of power to said IT equipment, wherein said electrical power comprises first and second power sources that operate independently of each other, wherein said second power path maintains a connection between said second power source and said IT equipment while said second power source has sustained a fault that prevents said second power source from providing power, wherein said first power path maintains a connection between said first power source and said IT equipment while said first power source has sustained a fault that prevents said first power source from providing power, wherein said power supply retains the same configuration regardless of how many of said power sources are operational, and wherein said first stages of said first and second power paths are non-isolated from each other.

14. The apparatus of claim 1, wherein said first stages of said first and second power paths each comprise a primary winding and wherein said primary windings are magnetically coupled to a secondary winding via a transformer.

15. The apparatus of claim 1, wherein said electrical power comprises power sources that work independently of each other, wherein each of said first stages of said first and second power paths comprises a transistor and a primary winding, wherein said transistor connects a corresponding one of said power sources to said primary winding, and wherein said power supply further comprises a controller that controls both of said transistors.

16. The apparatus of claim 1, wherein said electrical power comprises power sources that work independently of each other and wherein said power supply is configured to draw power only from whichever one of said first and second power sources offers a higher voltage.

17. The apparatus of claim 1, further comprising first and second shields disposed to surround said pair of first stages and said second stage, respectively, wherein said first and second shields have multiple apertures to promote air circulation.

18. The apparatus of claim 1, further comprising first and second heat shields disposed to surround said pair of first stages and said second stage, respectively and first and second grounded electromagnetic interference shields disposed to suppress electromagnetic interference resulting from operation of said pair of first stages and said second stage, wherein said electromagnetic interference shields and said heat shields both comprise apertures, and wherein said apertures on said electromagnetic interference shields are smaller than said apertures on said heat shields.

19. The apparatus of claim 1, wherein said pair of first stages is hot-swappable and said second stage is non-hot-swappable.

20. The apparatus of claim 1, wherein said power supply is non-hot-swappable.

21. The apparatus of claim 1, wherein said pair of first stages and said second stage are hot-swappable independently of each other.

22. The apparatus of claim 1, wherein said power supply comprises a first package and a second package, wherein said pair of first stages is disposed within said first package, wherein said second stage is disposed within said second package, wherein said first package is insertable between said electrical power and said second package, and wherein said second package is insertable between said load and said first package, whereby said pair of first stages is removable from said power supply without removing said second stage, and whereby said second stage is removable from said power supply without removing said pair of first stages.

23. The apparatus of claim 1, wherein said second stage is disposed on said motherboard without a package.

* * * * *